United States Patent
Kang et al.

(10) Patent No.: US 12,557,442 B2
(45) Date of Patent: Feb. 17, 2026

(54) DISPLAY DEVICE USING LIGHT EMITTING ELEMENTS HAVING ADHESIVE LAYERS AND MANUFACTURING METHOD THEREFOR

(71) Applicant: LG ELECTRONICS INC., Seoul (KR)

(72) Inventors: Eunjeong Kang, Seoul (KR); Byungjoon Rhee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 711 days.

(21) Appl. No.: 17/782,316

(22) PCT Filed: Dec. 31, 2019

(86) PCT No.: PCT/KR2019/018764
§ 371 (c)(1),
(2) Date: Jun. 3, 2022

(87) PCT Pub. No.: WO2021/125421
PCT Pub. Date: Jun. 24, 2021

(65) Prior Publication Data
US 2022/0384686 A1   Dec. 1, 2022

(30) Foreign Application Priority Data
Dec. 19, 2019   (KR) ..................... 10-2019-0170795

(51) Int. Cl.
*H10H 20/831*   (2025.01)
*G09F 9/30*   (2006.01)
(Continued)

(52) U.S. Cl.
CPC ......... *H10H 20/8312* (2025.01); *G09F 9/301* (2013.01); *H10H 20/01* (2025.01);
(Continued)

(58) Field of Classification Search
CPC ............ H10H 20/857; H10H 20/0364; H10H 20/831; H10H 20/83
See application file for complete search history.

(56) References Cited

U.S. PATENT DOCUMENTS

2008/0180376 A1   7/2008   Kim et al.
2018/0019234 A1   1/2018   Hu
(Continued)

FOREIGN PATENT DOCUMENTS

KR   10-2008-0046371 A   5/2008
KR   10-2017-0104086 A   9/2017
(Continued)

*Primary Examiner* — Jesse Y Miyoshi
(74) *Attorney, Agent, or Firm* — Birch, Stewart, Kolasch & Birch, LLP

(57) ABSTRACT

Discussed is a display device using a light emitting device includes a plurality of anode electrodes, a plurality of cathode electrodes positioned on one side of the anode electrodes, and a plurality of light emitting device assemblies electrically connected to the anode and cathode electrodes to configure individual sub-pixels. The light emitting device assembly includes a light emitting device, a first electrode disposed on the light emitting device and electrically connected to the anode electrode through conductive balls, a second electrode disposed on the light emitting device and electrically connected to the cathode electrode by conductive balls, first adhesive layers disposed on the first electrode and the second electrode to be spaced apart from each other, and a second non-conductive adhesive layer positioned on the first adhesive layers.

12 Claims, 19 Drawing Sheets

(51) Int. Cl.
  *H10H 20/01* (2025.01)
  *H10H 20/857* (2025.01)
  *H10H 29/14* (2025.01)

(52) U.S. Cl.
  CPC ........ *H10H 20/857* (2025.01); *H10H 29/142* (2025.01); *H10H 20/032* (2025.01); *H10H 20/0364* (2025.01)

(56) References Cited

U.S. PATENT DOCUMENTS

| | | |
|---|---|---|
| 2018/0076182 A1 | 3/2018 | Wu et al. |
| 2019/0148611 A1 | 5/2019 | He et al. |
| 2020/0044115 A1* | 2/2020 | Hashimoto ......... H01L 25/0753 |
| 2021/0005588 A1* | 1/2021 | Chung .................... H01L 24/83 |

FOREIGN PATENT DOCUMENTS

| | | |
|---|---|---|
| KR | 10-2018-0038272 A | 4/2018 |
| KR | 10-2018-0120527 A | 11/2018 |
| KR | 10-2019-0068413 A | 6/2019 |
| KR | 10-1987698 B1 | 6/2019 |

* cited by examiner

【FIG. 1】
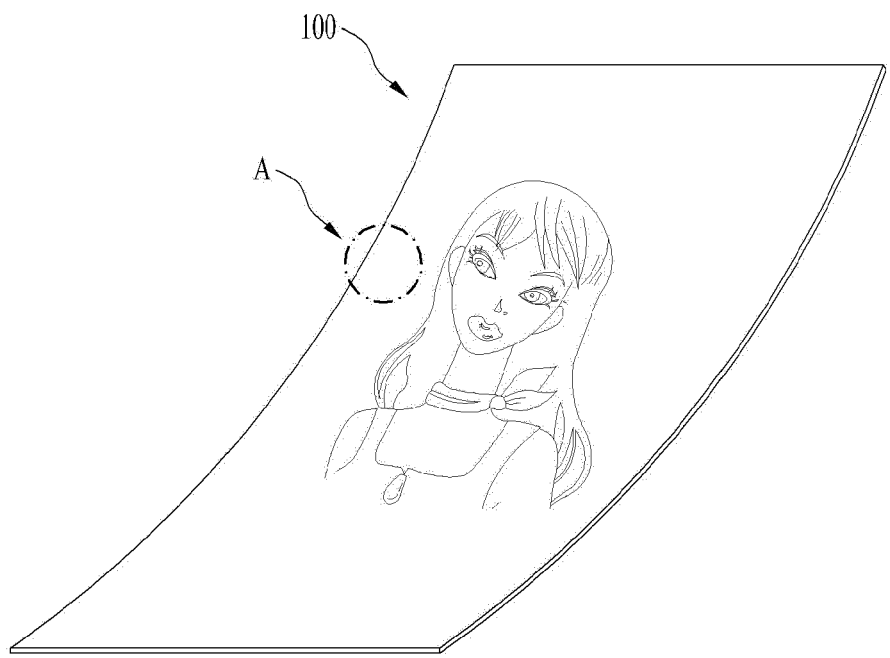
【FIG. 2】
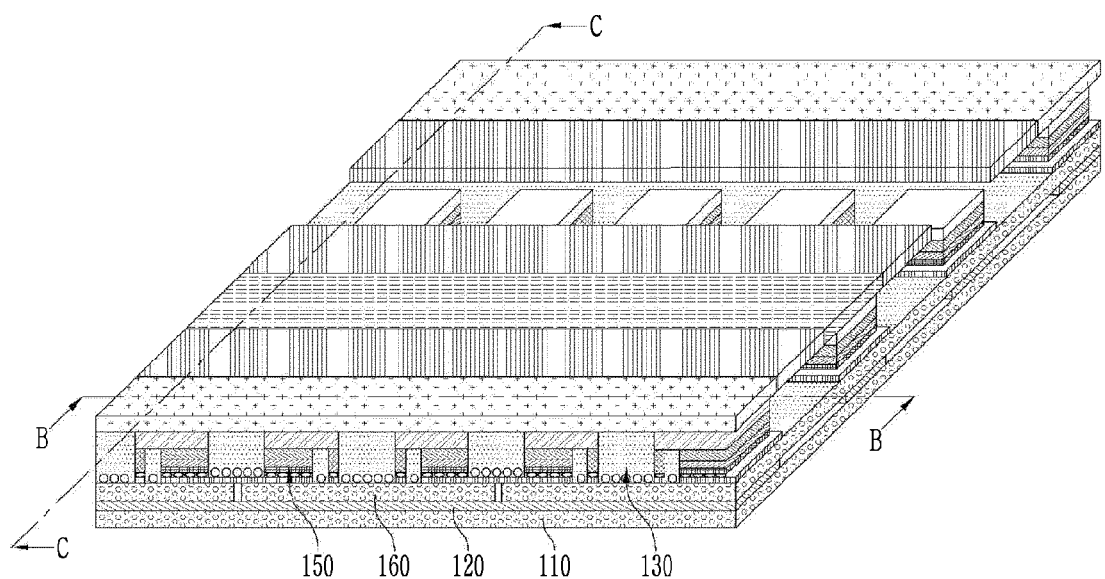

[FIG. 3a]
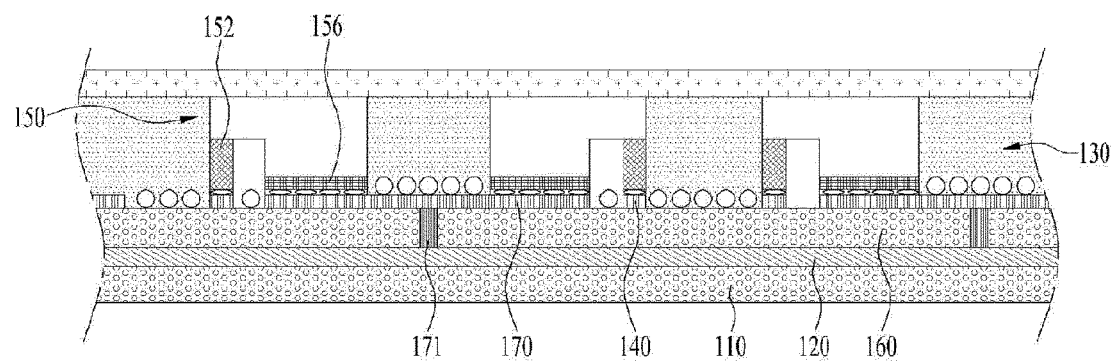
[FIG. 3b]
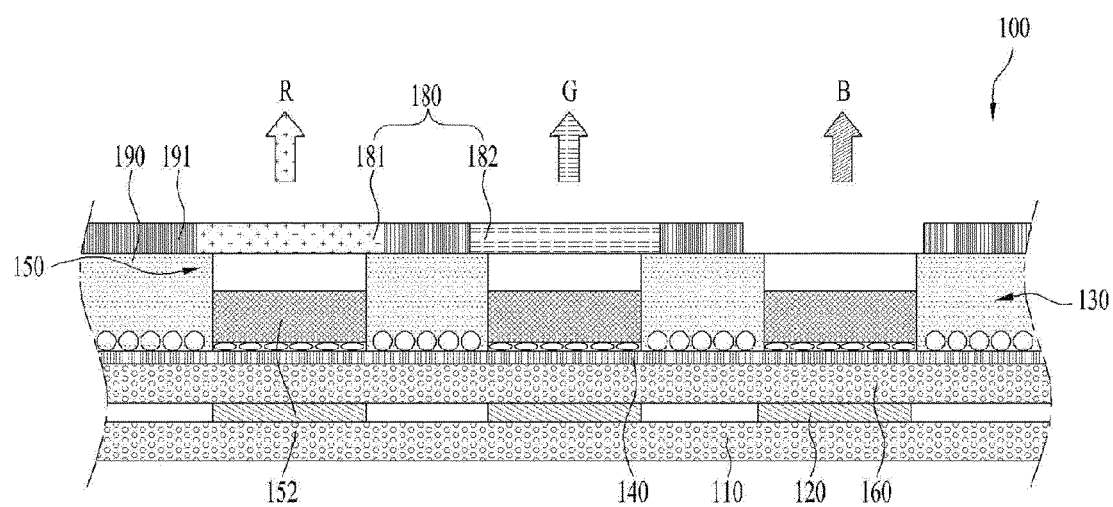

[FIG. 4]
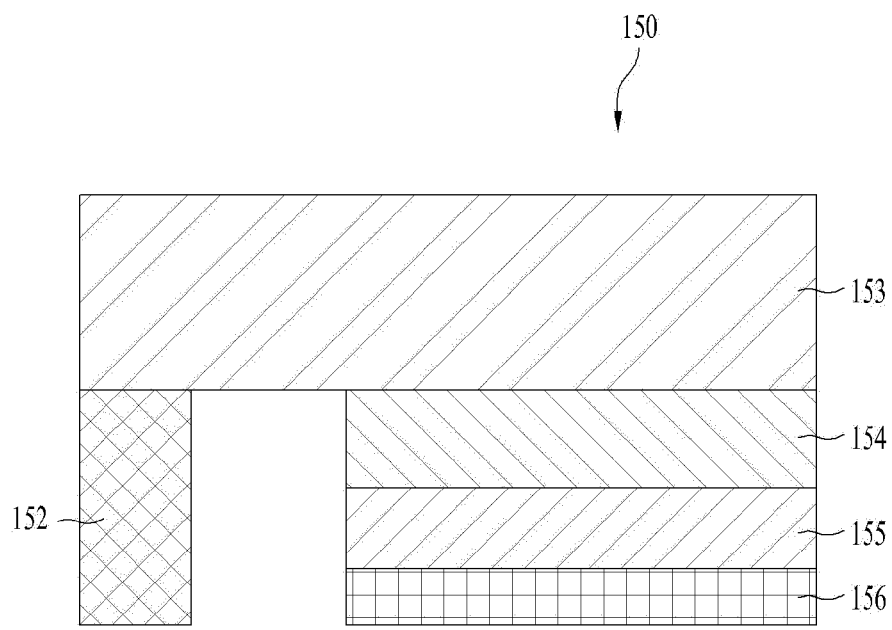
[FIG. 5a]
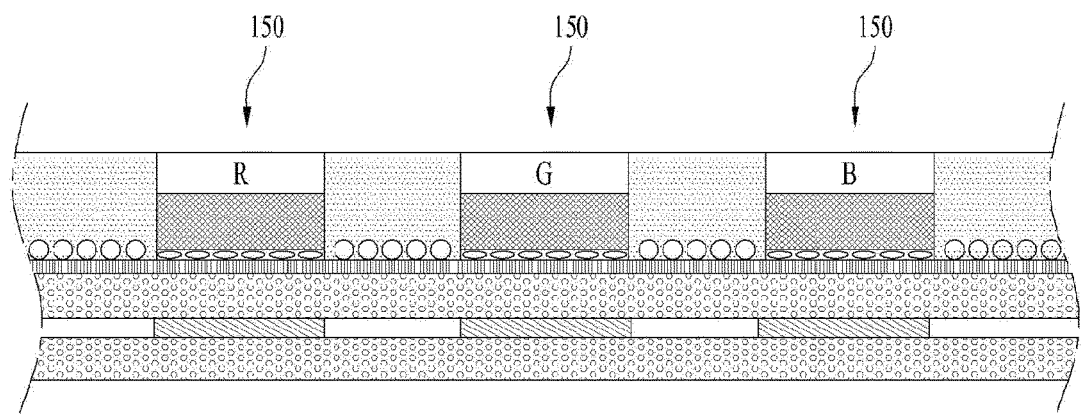

[FIG. 5b]
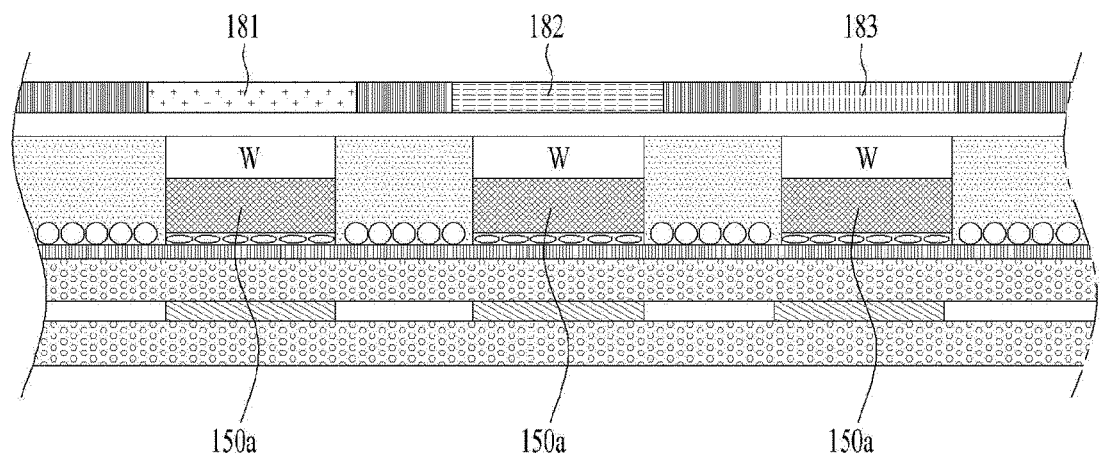
[FIG. 5c]
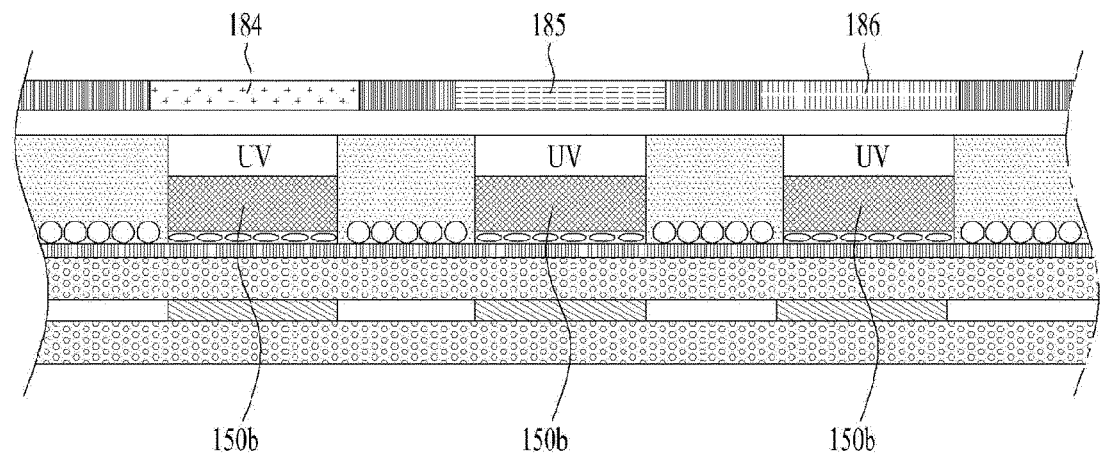

[FIG. 6]
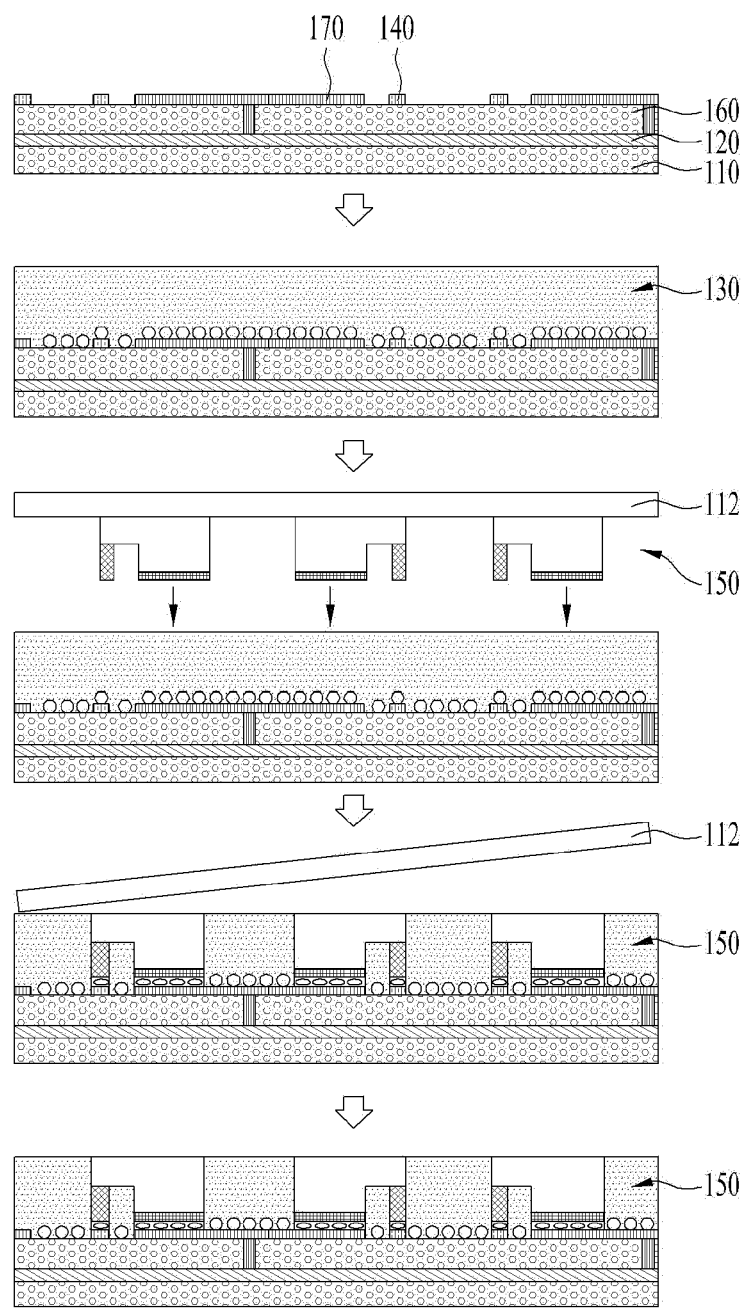

【FIG. 7】
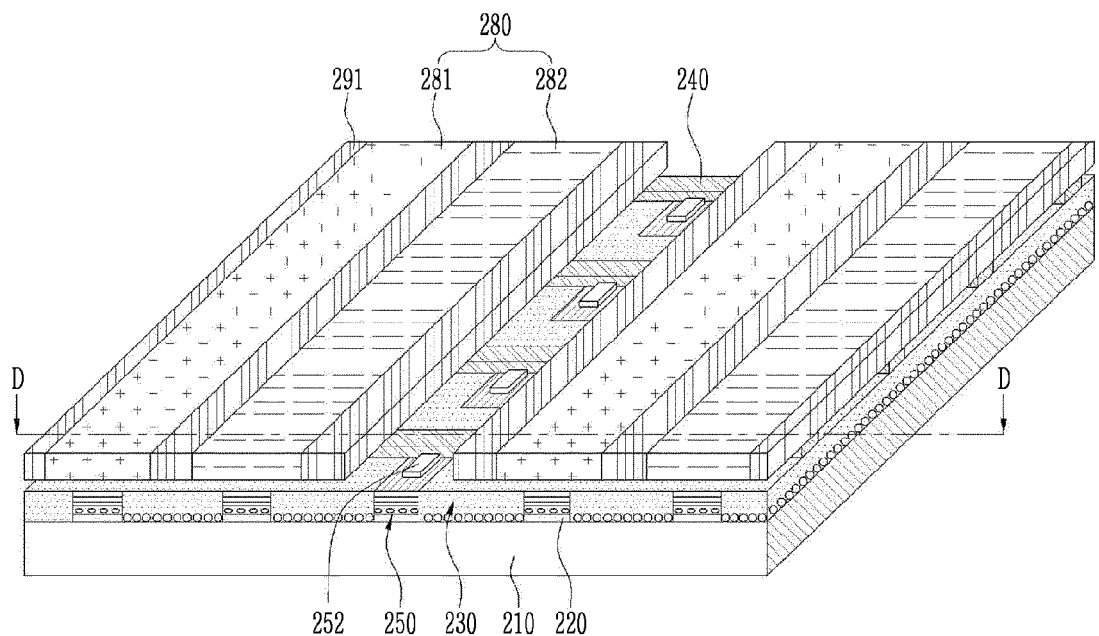
【FIG. 8】
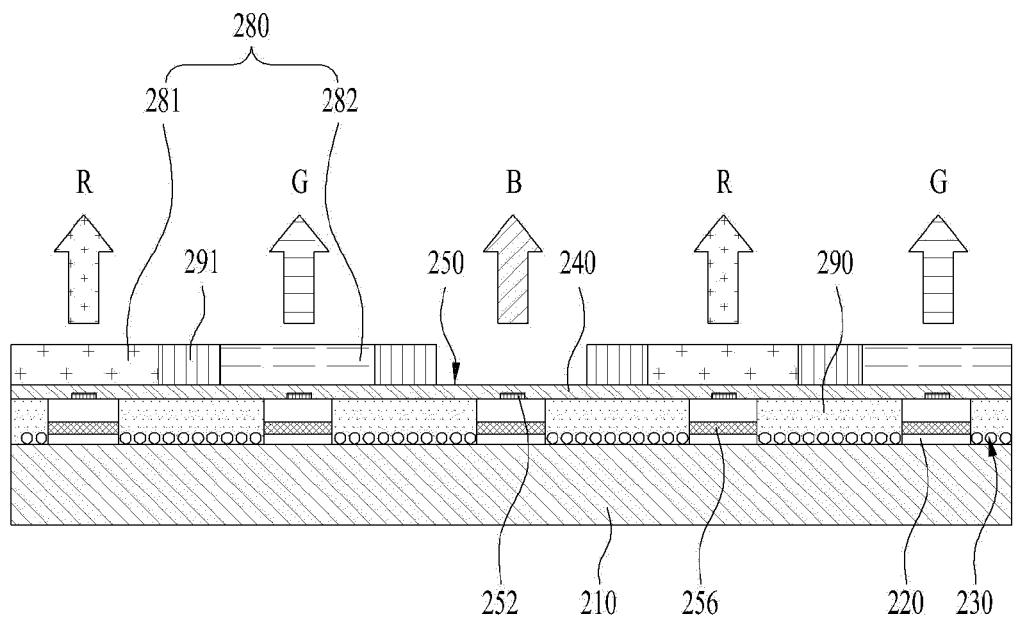

[FIG. 9]
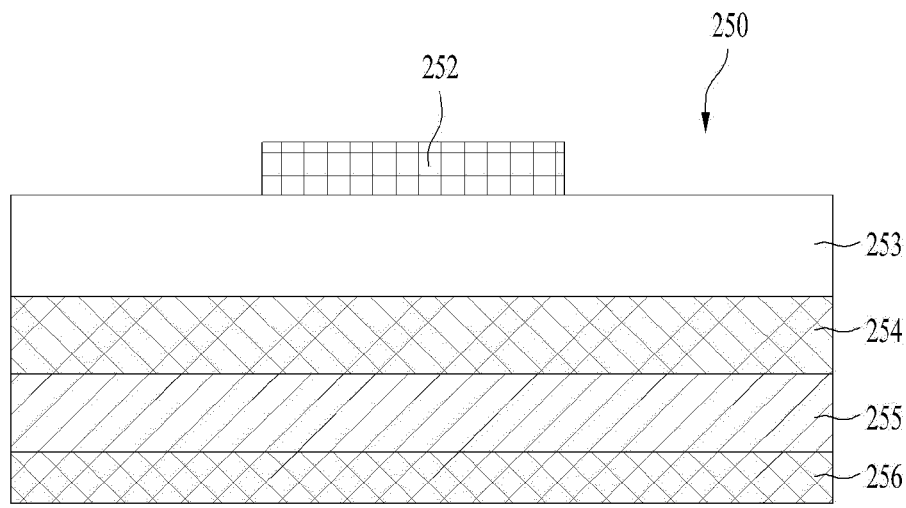
[FIG. 10]
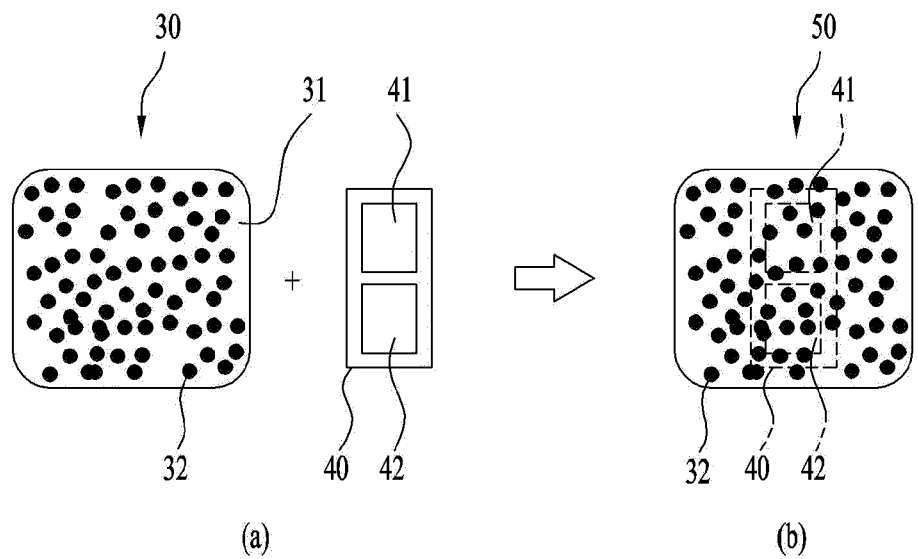
(a)　　　　　　　　　(b)

【FIG. 11】
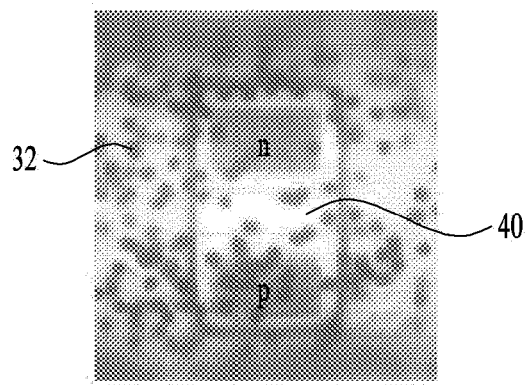
【FIG. 12】
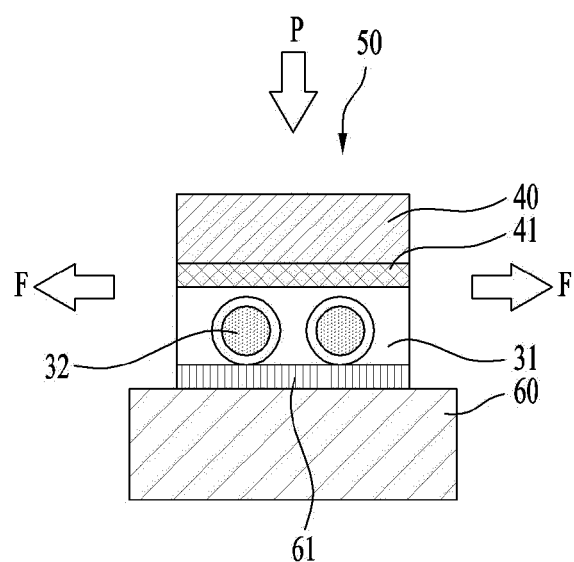

[FIG. 13]
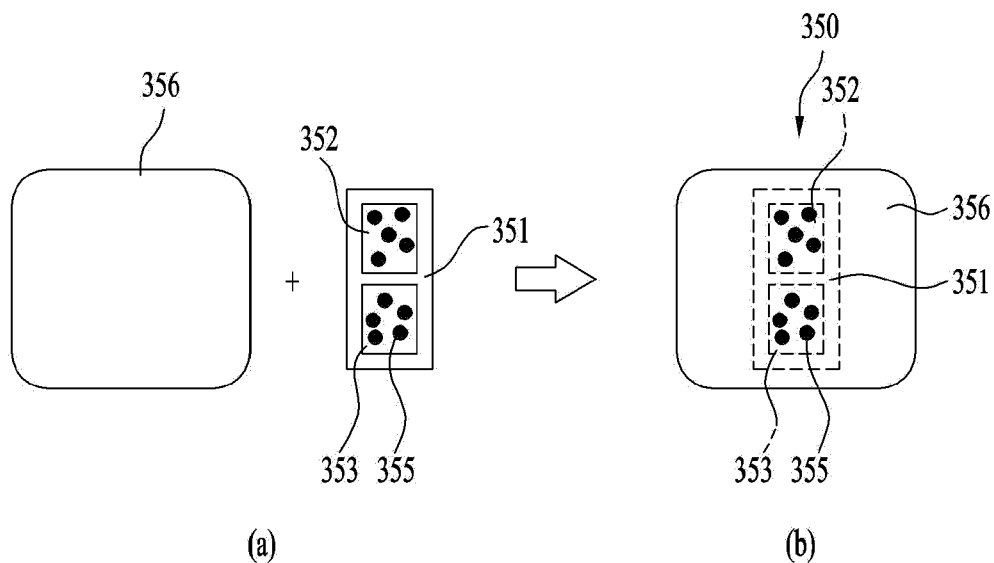
(a)    (b)
[FIG. 14]
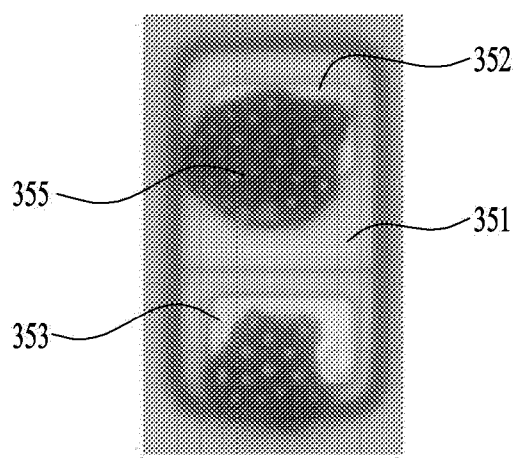

【FIG. 15】
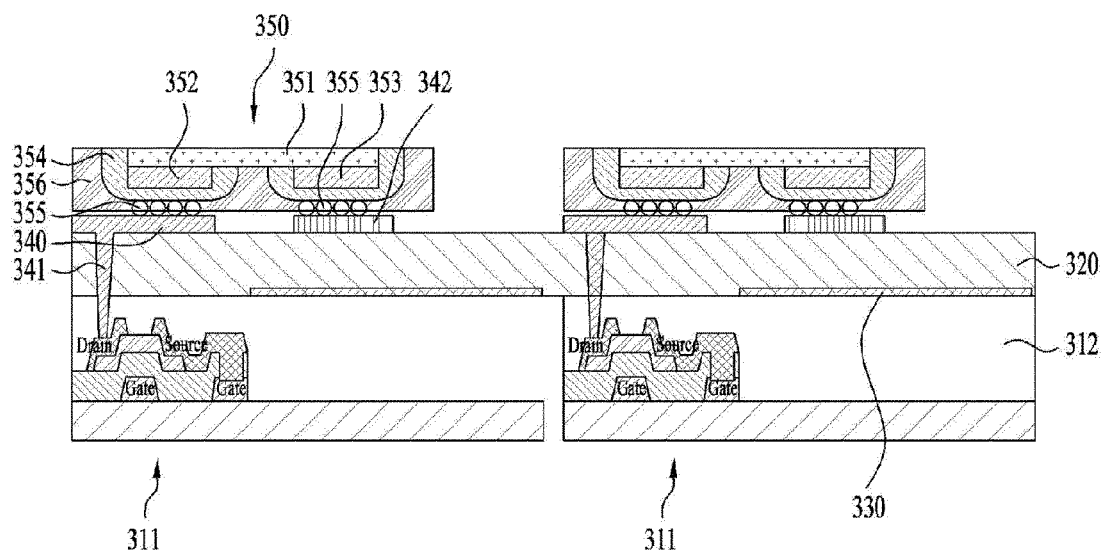
【FIG. 16】
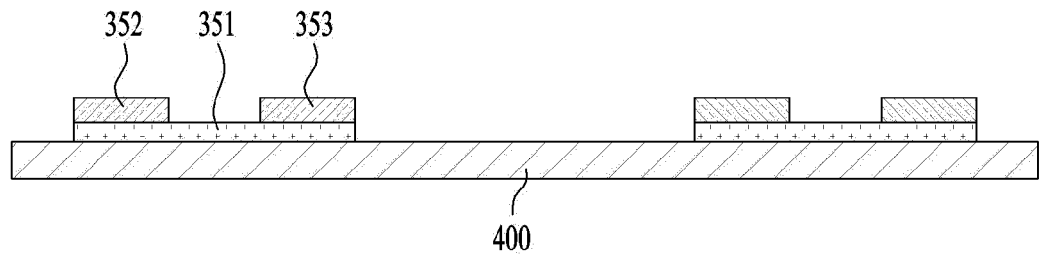
【FIG. 17】
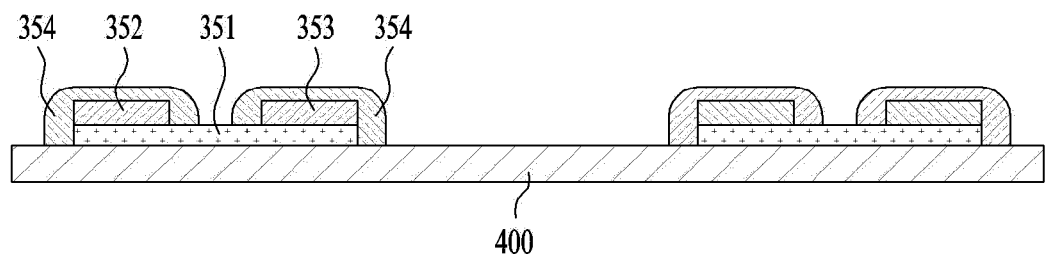

【FIG. 18】
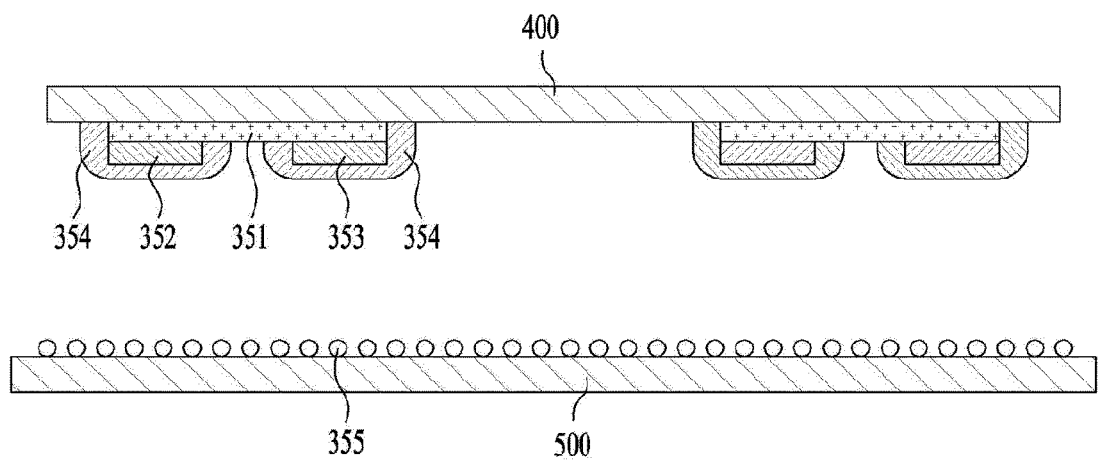
【FIG. 19】
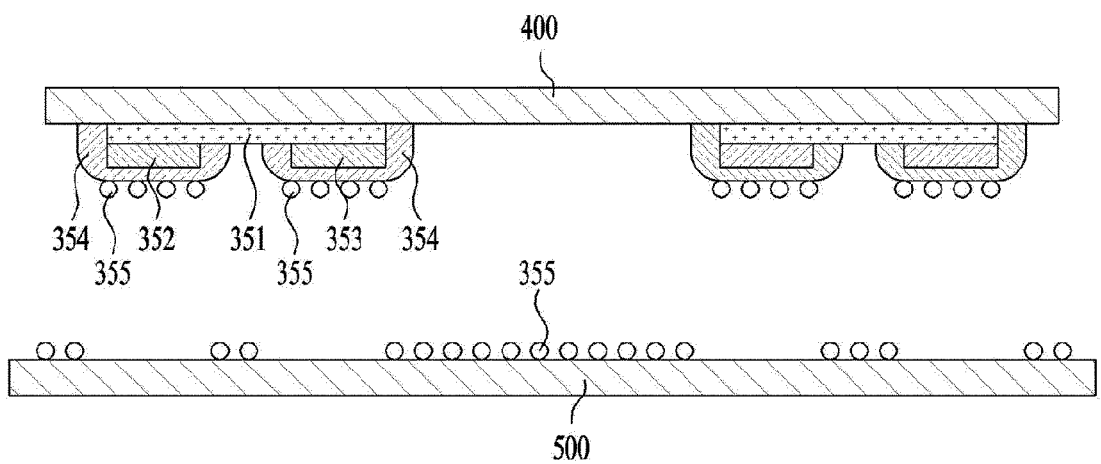

[FIG. 20]
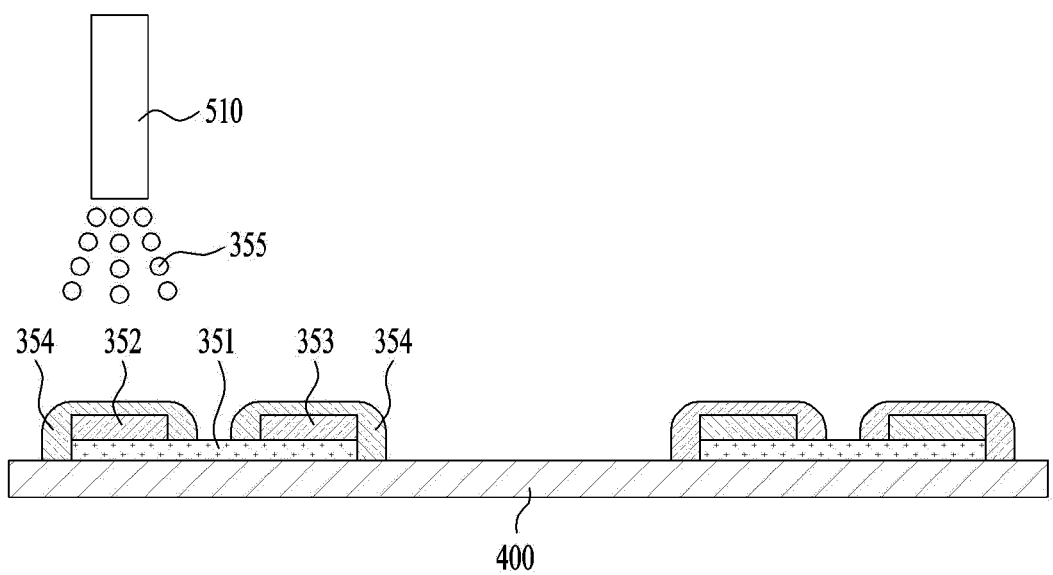
[FIG. 21]
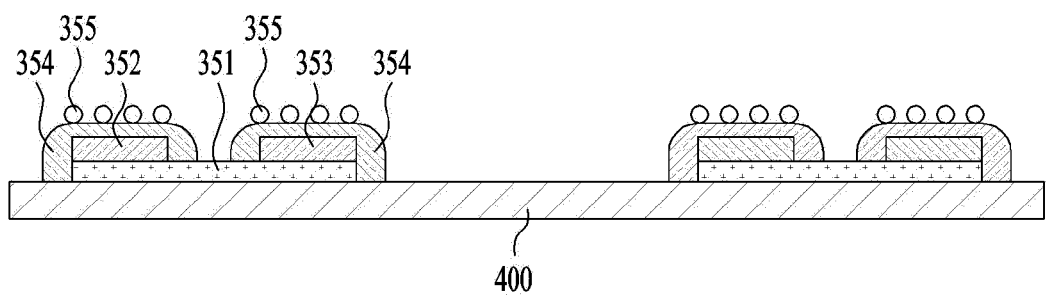

[FIG. 22]
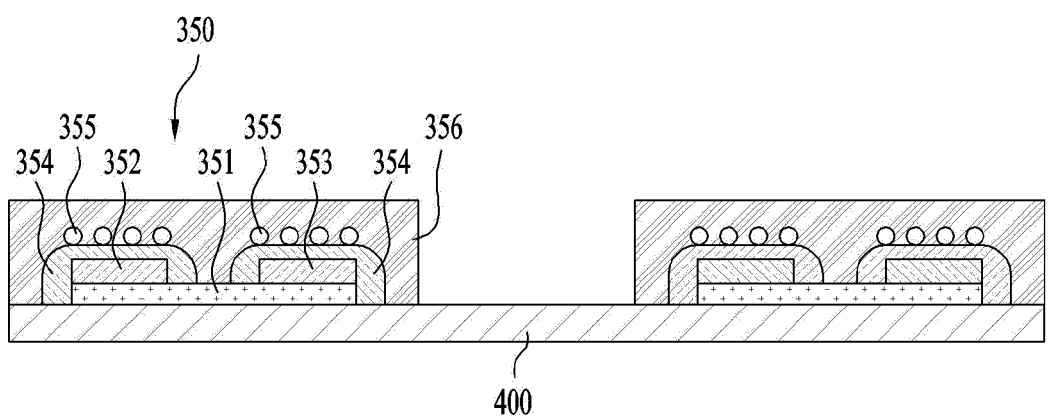

【FIG. 23】
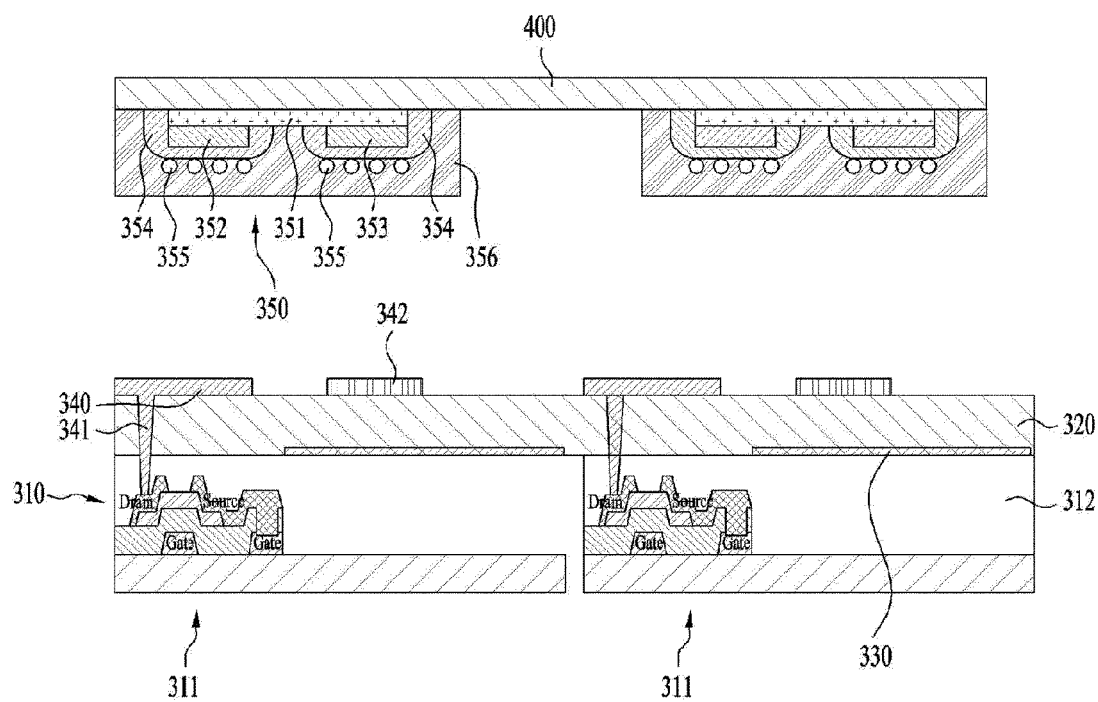
【FIG. 24】
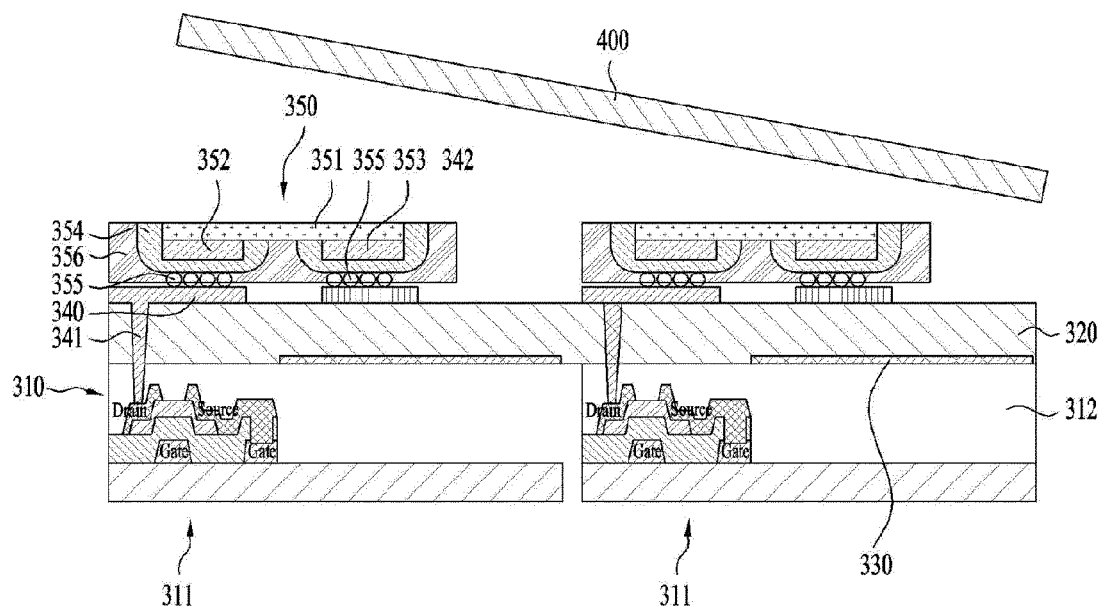

[FIG. 25]
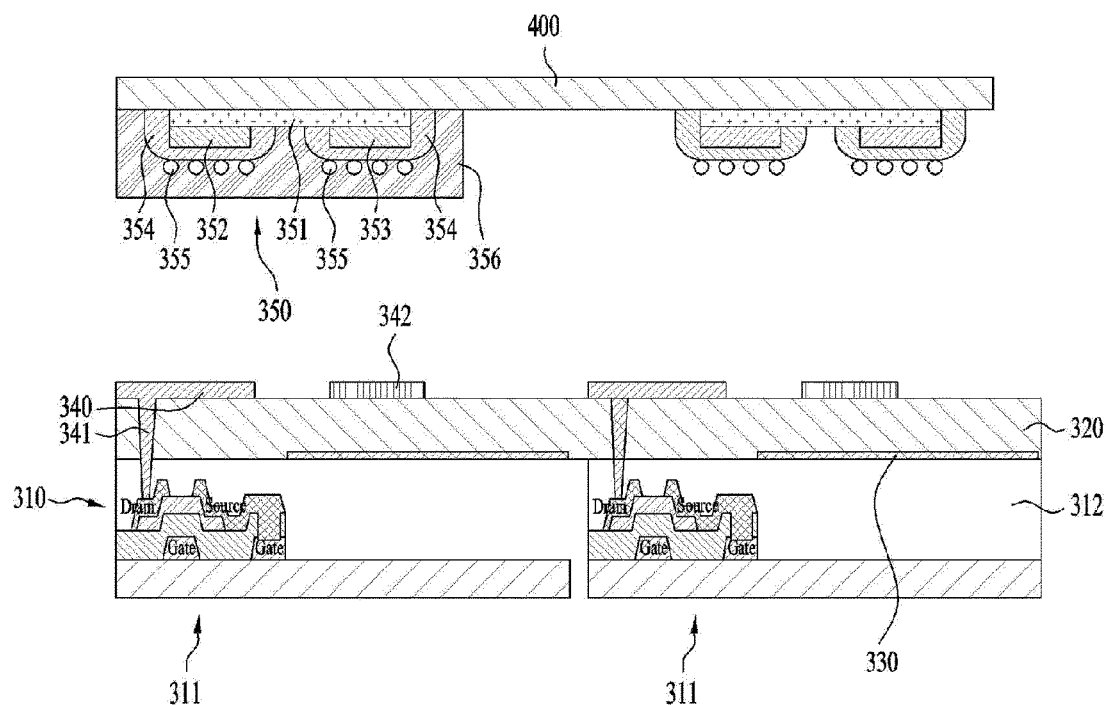
[FIG. 26]
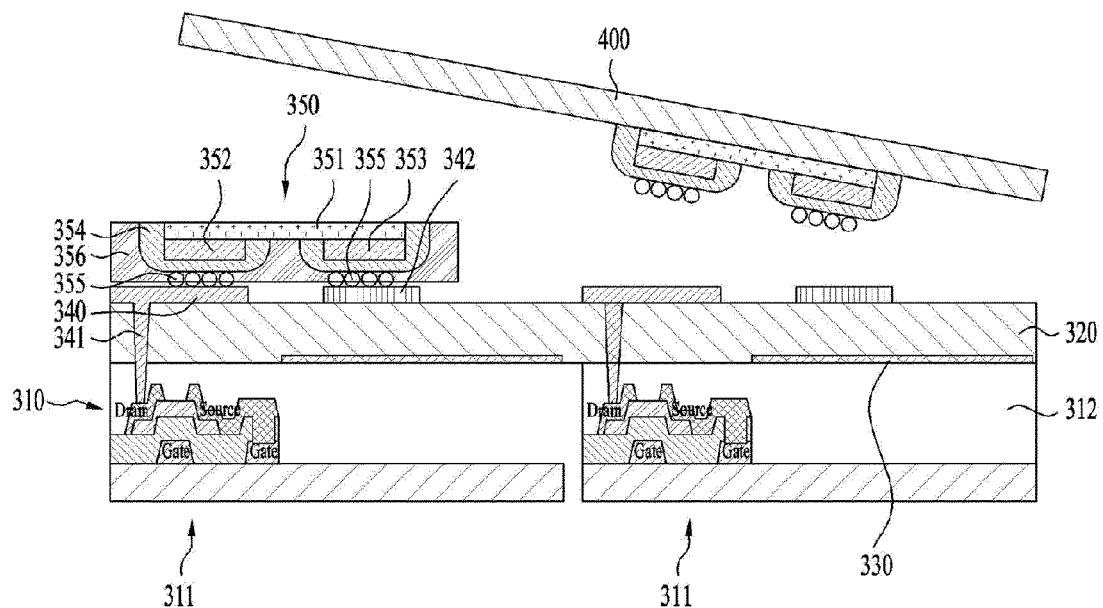

[FIG. 27]
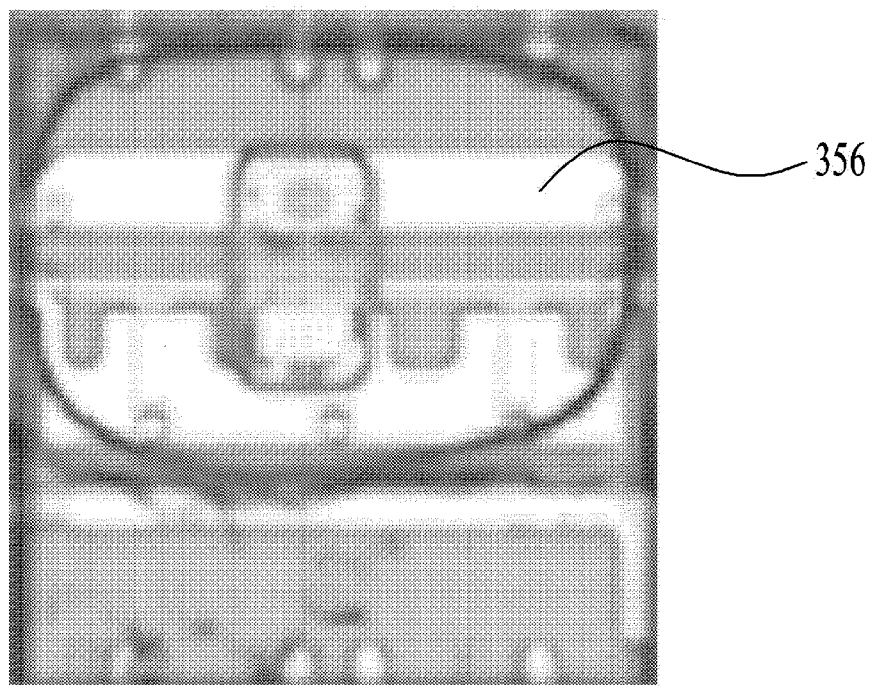

[FIG. 28]
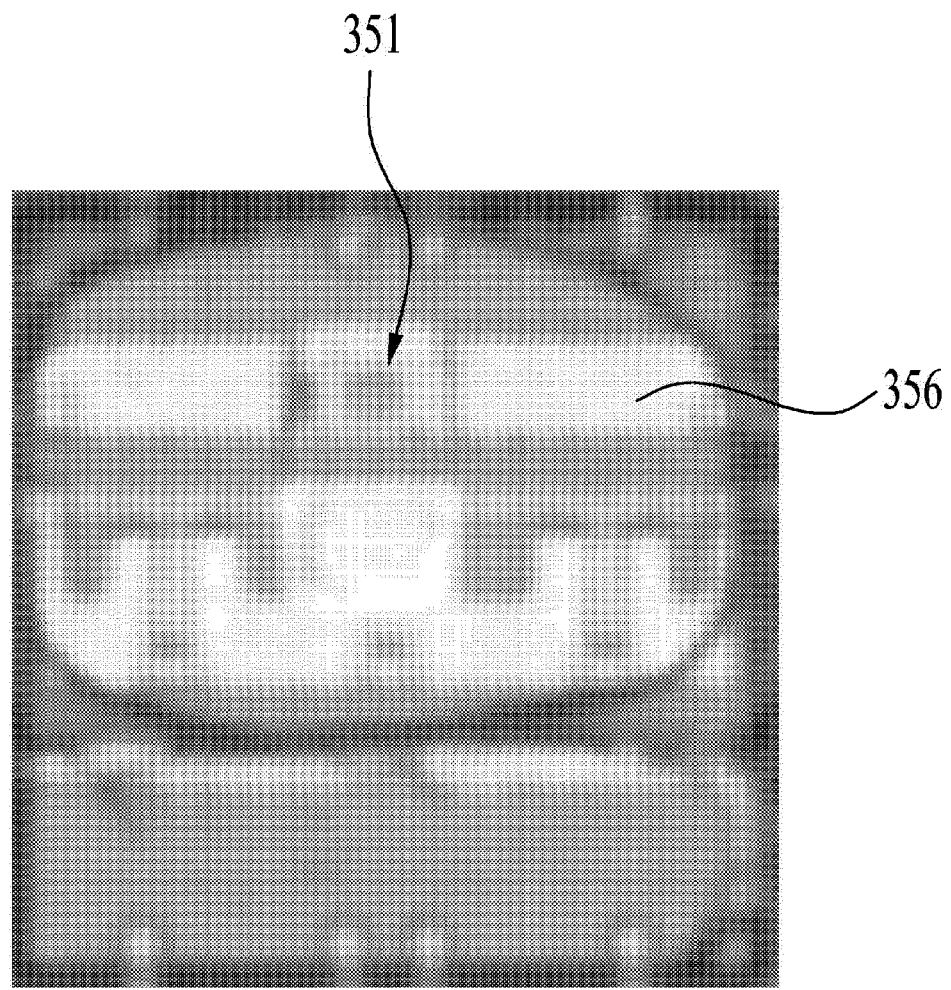

[FIG. 29]
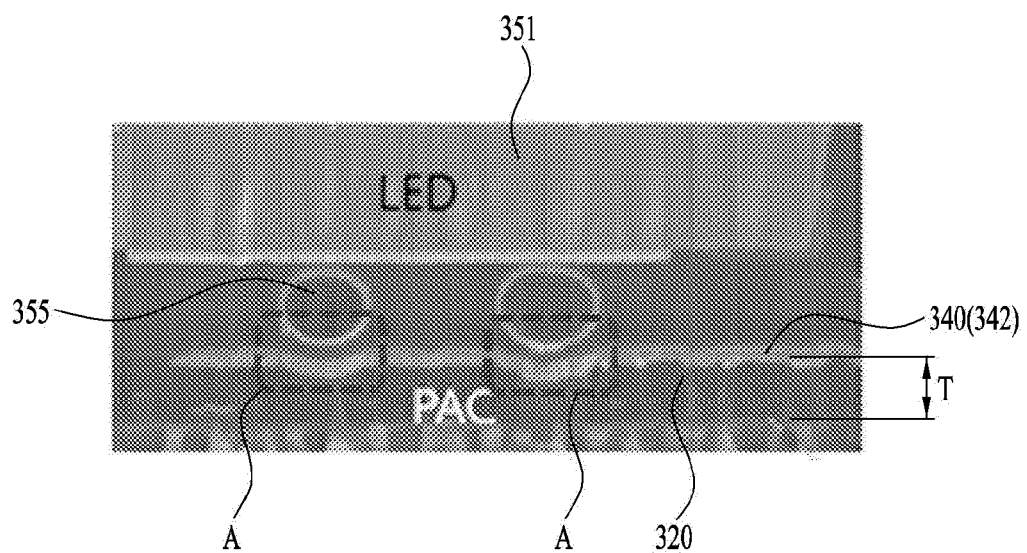

【FIG. 30】
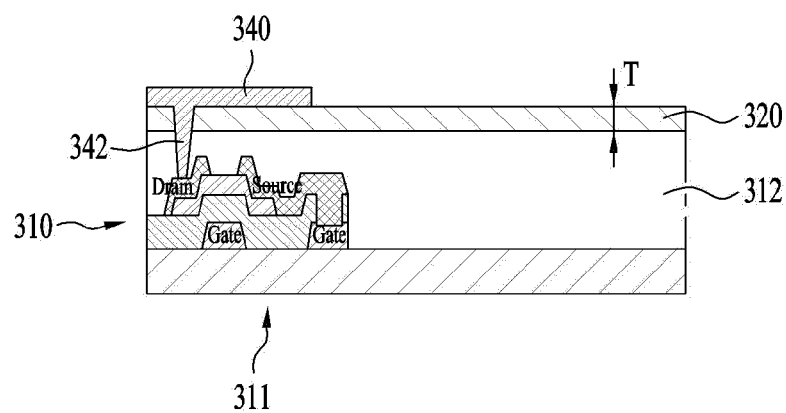

DISPLAY DEVICE USING LIGHT EMITTING ELEMENTS HAVING ADHESIVE LAYERS AND MANUFACTURING METHOD THEREFOR

CROSS REFERENCE TO RELATED APPLICATIONS

This application is the National Stage filing under 35 U.S.C. 371 of International Application No. PCT/KR2019/018764, filed on Dec. 31, 2019, which claims the benefit of earlier filing date and right of priority to Korean Application No. 10-2019-0170795, filed on Dec. 19, 2019, the contents of all these applications are hereby incorporated by reference herein in their entirety.

TECHNICAL FIELD

The present disclosure is applicable to a display device-related technical field, for example, relates to a display device using a micro LED (light emitting diode) and a method for manufacturing the same.

BACKGROUND ART

In recent years, display devices having excellent characteristics such as low profile, flexibility and the like have been developed in the display technical field. On the contrary, currently commercialized main displays are represented by liquid crystal displays (LCDs) and active matrix organic light emitting devices (AMOLEDs).

However, there exist problems such as not-so-fast response time, difficult implementation of flexibility in case of LCDs, and there exist drawbacks such as short life span, not-so-good yield as well as low flexibility in case of AMOLEDs.

On the other hand, light emitting diodes (LEDs) are well known light emitting devices for converting an electrical current to light, and have been used as a light source for displaying an image in an electronic device including information communication devices since red LEDs using GaAsP compound semiconductors were made commercially available in 1962, together with a GaP:N-based green LEDs. Accordingly, the semiconductor light emitting devices may be used to implement a flexible display, thereby presenting a scheme for solving the problems. The semiconductor light emitting device has various advantages, such as a long lifespan, low power consumption, excellent initial driving characteristics, and high vibration resistance, compared to a filament-based light emitting device.

The size of such a semiconductor light emitting device has recently been reduced to several tens of micrometers. Therefore, when a display device is implemented using such small-sized semiconductor light emitting devices, a very large number of semiconductor light emitting devices are to be assembled on a wiring board of the display device.

However, in the process of assembling the light emitting devices, it is very difficult to precisely locate a number of semiconductor light emitting devices at desired positions on the wiring board.

On the other hand, although the light emitting devices may be directly attached to the wiring board using an anisotropic conductive film (ACF), a problem may occur in attaching a plurality of light emitting devices for a display.

That is, the electrode of the light emitting device and the electrode (e.g., anode) on a thin film transistor substrate are electrically connected through conductive balls dispersed on an adhesive layer (the adhesive layer in which these conductive balls are dispersed may form an anisotropic conductive film).

In this process, a bonding pressure is applied from the upper side while the conductive balls are positioned between the electrode of the light emitting device and the electrode on the thin film transistor substrate. Due to the bonding pressure, the conductive balls electrically connect the electrode of the light emitting device and the electrode on the thin film transistor substrate.

However, when the bonding pressure is applied, the adhesive layer flows in peripheral directions. That is, the flow of the adhesive layer in the peripheral directions is caused by the action of the bonding pressure.

As the conductive balls flow together with the adhesive layer due to the flow of the adhesive layer, the electrode of the light emitting device and the electrode on the thin film transistor substrate may not be electrically connected (circuit open).

In particular, although several light emitting devices can be electrically connected, there may be limitations in electrical connection of the entire array of many light emitting devices used in a display. That is, in the electrical connection of the entire light emitting device array used as sub-pixels of the display device, a phenomenon in which a plurality of light emitting devices are not electrically connected to the electrodes of the thin film transistor substrate (open) may occur.

In addition, when the number of conductive balls is increased to improve this phenomenon, a short circuit may occur between the two electrodes of the light emitting device.

Therefore, a method for overcoming these problems is required.

DISCLOSURE

Technical Problem

An object of the present disclosure is to provide a display device using a light emitting device capable of directly transferring a light emitting device grown on a growth substrate to a thin film transistor substrate, and a method for manufacturing the same.

An object of the present disclosure is to provide a display device using a light emitting device that does not have problems caused by conductive balls, that is, some light emitting devices are not electrically connected, or the two electrodes of one light emitting device are short-circuited although the light emitting device grown on a growth substrate is directly transferred to a display substrate, and a method for manufacturing the same.

In addition, an object of the present disclosure is to provide a display device using a light emitting device which is very advantageous for realizing a high resolution display device, and a method for manufacturing the same, since it is possible to directly transfer the light emitting device from a growth substrate to a thin film transistor substrate.

Technical Solution

According to a first aspect, a display device using a light emitting device may include a plurality of anode electrodes partitioned, a plurality of cathode electrodes positioned on one side of the anode electrodes, and a plurality of light emitting device assemblies electrically connected to the anode and cathode electrodes to configure individual sub-pixels.

The light emitting device assembly may include a light emitting device, a first electrode disposed on the light emitting device and electrically connected to the anode electrode by conductive balls, a second electrode disposed on the light emitting device and electrically connected to the cathode electrode by conductive balls, first adhesive layers disposed on the first electrode and the second electrode to be spaced apart from each other, and a second adhesive layer with non-conductive positioned on the first adhesive layer.

The conductive balls may be localized on the first adhesive layers.

The conductive balls may be localized between the anode electrode and the first electrode, and between the cathode electrode and the second electrode.

The first adhesive layer may be a conductive adhesive layer. The first adhesive layer may be a non-conductive adhesive layer.

The second adhesive layer may cover the first adhesive layers spaced apart from each other.

The second adhesive layer may cover the entire light emitting device.

The anode electrode and the cathode electrode may be arranged on a polymer insulating layer of a thin film transistor substrate to implement a flexible display.

The polymer insulating layer may have a thickness smaller than a diameter of the conductive ball.

According to a second aspect, a method for manufacturing a display device using a light emitting device may include forming first adhesive layers spaced apart from each other on a first electrode and a second electrode of the light emitting device arranged on a first substrate; localizing conductive balls on the first adhesive layers; forming a second adhesive layer on the conductive balls and the first adhesive layers; bonding the first electrode and the second electrode to an anode and a cathode electrodes disposed on a second substrate using the conductive balls; and separating the first substrate.

The localizing of the conductive balls may include transferring or applying conductive balls on the first adhesive layers spaced apart from each other.

The first substrate may be a growth substrate on which the light emitting device is grown.

The first substrate may be separated by a laser lift-off method.

The second substrate may be a passive matrix substrate or a thin film transistor substrate for implementing an active matrix.

According to a third aspect, a method of manufacturing a display device using a light emitting device, may include forming first adhesive layers spaced apart from each other on a first electrode and a second electrode of the light emitting device grown on a growth substrate and patterned into each light emitting device; localizing conductive balls on the first adhesive layers; forming a second adhesive layer on the conductive balls and the first adhesive layers; bonding the first electrode and the second electrode to an anode electrode and a cathode electrode disposed on a driving substrate using the conductive balls; and separating the growth substrate.

Advantageous Effects

According to an embodiment of the present disclosure, the following effects are obtained.

First, according to the embodiment of the present disclosure, it is possible to directly transfer the light emitting device from the growth substrate to the thin film transistor substrate.

In this case, problems caused by the conductive balls, that is, problems in which some light emitting devices are not electrically connected, or the two electrodes of one light emitting device are short-circuited, may not occur.

As described above, it is possible to directly transfer the light emitting device from the growth substrate to the thin film transistor substrate, making it very advantageous to implement a high-resolution display device.

Moreover, according to the present disclosure, the problems caused by the use of the conventional conductive balls can be solved, thus greatly improving the reliability, precision, and mass productivity of a micro LED display device.

In addition, the light emitting device may be selectively mounted in a desired position on the thin film transistor substrate, so that a display device may be manufactured in a hybrid combination of organic and inorganic light emitting devices. Therefore, it is possible to develop a device having the advantages of LED (inorganic light emitting device) and OLED (organic light emitting device).

In particular, since the LED has no moisture barrier layer unlike OLED, stacking is simple, making it suitable to be applied to a flexible display.

Furthermore, according to another embodiment of the present disclosure, there are additional technical effects not mentioned herein. Those skilled in the art can understand through the whole specification and drawings.

DESCRIPTION OF DRAWINGS

FIG. 1 is a conceptual diagram illustrating an example of a display device using a semiconductor light emitting device of the present disclosure.

FIG. 2 is a partially enlarged view of portion A of FIG. 1.

FIGS. 3A and 3B are cross-sectional views taken along lines B-B and C-C in FIG. 2.

FIG. 4 is a conceptual view illustrating the flip-chip type semiconductor light emitting device of FIG. 3.

FIGS. 5A to 5C are conceptual views illustrating various examples of implementation of colors in relation to a flip-chip type semiconductor light emitting device.

FIG. 6 shows cross-sectional views of a method of fabricating a display device using a semiconductor light emitting device according to the present disclosure.

FIG. 7 is a perspective view of another example of a display device using a semiconductor light emitting device according to the present disclosure.

FIG. 8 is a cross-sectional view taken along line D-D in FIG. 7, and

FIG. 9 is a conceptual diagram showing a vertical semiconductor light emitting device shown in FIG. 8.

FIG. 10 is a schematic diagram illustrating an example of a process for mounting a light emitting device using a conductive adhesive layer.

FIG. 11 is a photograph showing an actual example of a light emitting device attached by a conductive adhesive layer.

FIG. 12 is a cross-sectional schematic view illustrating an example of a process of mounting a light emitting device using a conductive adhesive layer.

FIG. 13 is a schematic diagram illustrating a process of mounting a light emitting device using a conductive adhesive layer according to an embodiment of the present disclosure.

FIG. 14 is a photograph showing an actual example of a light emitting device attached by a conductive adhesive layer according to an embodiment of the present disclosure.

FIG. 15 is a cross-sectional view illustrating a display device using a semiconductor light emitting device according to an embodiment of the present disclosure.

FIGS. 16 to 26 are cross-sectional views illustrating a process of manufacturing a display device using semiconductor light emitting devices according to an embodiment of the present disclosure.

FIG. 27 is a photograph illustrating a state in which a light emitting device of a display device using a semiconductor light emitting device is bonded according to an embodiment of the present disclosure.

FIG. 28 is a photograph showing a state in which a light emitting device is turned on in the state of FIG. 27.

FIG. 29 is a cross-sectional photograph showing an example of a state in which a light emitting device is boned to an electrode by conductive balls.

FIG. 30 is a cross-sectional view showing a second substrate of a display device using a semiconductor light emitting device according to an embodiment of the present disclosure.

MODE FOR INVENTION

Hereinafter, the embodiments disclosed herein will be described in detail with reference to the accompanying drawings, and the same or similar elements are designated with the same numeral references regardless of the numerals in the drawings and their redundant description will be omitted. The suffixes "module" and "unit or portion" for components used in the following description are merely provided only for facilitation of preparing this specification, and thus they are not granted a specific meaning or function. In addition, when it is determined that detailed descriptions of related known technologies may obscure the gist of the embodiments disclosed in this specification in describing the embodiments disclosed in this specification, the same or similar components are given the same reference numbers regardless of reference numerals, and overlapping descriptions thereof will be omitted in a case where the embodiments disclosed in this specification are described in detail with reference to the accompanying drawings. The suffixes "module" and "unit or portion" for components used in the following description are merely provided only for facilitation of preparing this specification, and thus they are not granted a specific meaning or function. In addition, when it is determined that the detailed description of the related known technology may obscure the gist of embodiments disclosed herein in describing the embodiments, a detailed description thereof will be omitted. Further, it should be noted that the accompanying drawings are only for easy understanding of the embodiments disclosed in the present specification, and should not be construed as limiting the technical spirit disclosed in the present specification by the accompanying drawings.

Furthermore, although each drawing is described for convenience of description, it is also within the scope of the present disclosure that those skilled in the art implement other embodiments by combining at least two or more drawings.

It is also understood that when an element, such as a layer, region, or substrate, it is referred to as being "on" another element, it may be directly present on the other element or intervening elements in between.

A display device described herein is a concept including all display devices that display information in a unit pixel or a set of unit pixels. Therefore, the display device can be applied not only to a finished product but also to parts. For example, a panel corresponding to a part of a digital TV also independently corresponds to a display device in the present specification. The finished products include a mobile phone, a smartphone, a laptop, a digital broadcasting terminal, a personal digital assistant (PDA), a portable multimedia player (PMP), a navigation system, a slate PC, a tablet, an Ultrabook, a digital TV, a desktop computer, and the like.

However, it will be readily apparent to those skilled in the art that the configuration according to the embodiments described in the present specification may be applied to a device capable of display having even a new product form to be developed later.

In addition, a semiconductor light emitting device mentioned in this specification is a concept including an LED, a micro LED, and the like, and may be used interchangeably therewith.

FIG. 1 is a conceptual view illustrating an embodiment of a display device using a semiconductor light emitting device according to the present disclosure.

As shown in FIG. 1, information processed by a controller (not shown) of a display device 100 may be displayed using a flexible display.

The flexible display may include, for example, a display that can be warped, bent, twisted, folded, or rolled by external force.

Furthermore, the flexible display may be, for example, a display manufactured on a thin and flexible substrate that can be warped, bent, folded, or rolled like paper while maintaining the display characteristics of a conventional flat panel display.

When the flexible display remains in an unbent state (e.g., a state having an infinite radius of curvature) (hereinafter referred to as a first state), the display area of the flexible display forms a flat surface. When the display in the first state is changed to a bent state (e.g., a state having a finite radius of curvature) (hereinafter referred to as a second state) by external force, the display area may be a curved surface. As shown in FIG. 1, the information displayed in the second state may be visual information output on a curved surface. Such visual information may be implemented by independently controlling the light emission of sub-pixels arranged in a matrix form. The unit pixel may mean, for example, a minimum unit for implementing one color.

The unit pixel of the flexible display may be implemented by a semiconductor light emitting device. In the present disclosure, a light emitting device (LED) is exemplified as a type of the semiconductor light emitting device configured to convert electric current into light. An example of the light emitting device may be a light emitting diode (LED). Such a light emitting diode is formed to have a small size, so that it can serve as a unit pixel even in the second state.

Hereinafter, a flexible display implemented using the light emitting diode will be described in more detail with reference to the drawings.

FIG. 2 is a partially enlarged view of portion A of FIG. 1.

FIGS. 3A and 3B are cross-sectional views taken along lines B-B and C-C in FIG. 2.

As shown in FIGS. 2, 3A and 3B, the display device 100 using a passive matrix (PM) type semiconductor light emitting device is exemplified as the display device 100 using a semiconductor light emitting device. However, the examples described below are also applicable to an active matrix (AM) type semiconductor light emitting device.

The display device 100 shown in FIG. 1 may include a substrate 110, a first electrode 120, a conductive adhesive layer 130, a second electrode 140, and at least one semiconductor light emitting device 150, as shown in FIG. 2.

The substrate 110 may be a flexible substrate. For example, to implement a flexible display device, the substrate 110 may include glass or polyimide (PI). Any insulative and flexible material such as polyethylene naphthalate (PEN) or polyethylene terephthalate (PET) may be employed. In addition, the substrate 110 may be formed of either a transparent material or an opaque material.

The substrate 110 may be a wiring substrate on which the first electrode 120 is disposed. Thus, the first electrode 120 may be positioned on the substrate 110.

As shown in FIG. 3A, an insulating layer 160 may be disposed on the substrate 110 on which the first electrode 120 is positioned, and an auxiliary electrode 170 may be positioned on the insulating layer 160. In this case, a stack in which the insulating layer 160 is laminated on the substrate 110 may be a single wiring substrate. More specifically, the insulating layer 160 may be formed of an insulative and flexible material such as PI, PET, or PEN, and may be integrated with the substrate 110 to form a single substrate.

The auxiliary electrode 170, which is an electrode that electrically connects the first electrode 120 and the semiconductor light emitting device 150, is positioned on the insulating layer 160, and is disposed to correspond to the position of the first electrode 120. For example, the auxiliary electrode 170 may have a dot shape and may be electrically connected to the first electrode 120 by an electrode hole 171 formed through the insulating layer 160. The electrode hole 171 may be formed by filling a via hole with a conductive material.

As shown in FIG. 2 or 3A, a conductive adhesive layer 130 may be formed on one surface of the insulating layer 160, but embodiments of the present disclosure are not limited thereto. For example, a layer performing a specific function may be formed between the insulating layer 160 and the conductive adhesive layer 130, or the conductive adhesive layer 130 may be disposed on the substrate 110 without the insulating layer 160. In a structure in which the conductive adhesive layer 130 is disposed on the substrate 110, the conductive adhesive layer 130 may serve as an insulating layer.

The conductive adhesive layer 130 may be a layer having adhesiveness and conductivity. For this purpose, a material having conductivity and a material having adhesiveness may be mixed in the conductive adhesive layer 130. In addition, the conductive adhesive layer 130 may have ductility, thereby providing making the display device flexible.

As an example, the conductive adhesive layer 130 may be an anisotropic conductive film (ACF), an anisotropic conductive paste, a solution containing conductive particles, or the like. The conductive adhesive layer 130 may be configured as a layer that allows electrical interconnection in the direction of the Z-axis extending through the thickness, but is electrically insulative in the horizontal X-Y direction. Accordingly, the conductive adhesive layer 130 may be referred to as a Z-axis conductive layer (hereinafter, referred to simply as a "conductive adhesive layer").

The ACF is a film in which an anisotropic conductive medium is mixed with an insulating base member. When the ACF is subjected to heat and pressure, only a specific portion thereof becomes conductive by the anisotropic conductive medium. Hereinafter, it will be described that heat and pressure are applied to the ACF. However, another method may be used to make the ACF partially conductive. The other method may be, for example, application of only one of the heat and pressure or UV curing.

In addition, the anisotropic conductive medium may be, for example, conductive balls or conductive particles. For example, the ACF may be a film in which conductive balls are mixed with an insulating base member. Thus, when heat and pressure are applied to the ACF, only a specific portion of the ACF is allowed to be conductive by the conductive balls. The ACF may contain a plurality of particles formed by coating the core of a conductive material with an insulating film made of a polymer material. In this case, as the insulating film is destroyed in a portion to which heat and pressure are applied, the portion is made to be conductive by the core. At this time, the cores may be deformed to form layers that contact each other in the thickness direction of the film. As a more specific example, heat and pressure are applied to the whole ACF, and an electrical connection in the Z-axis direction is partially formed by the height difference of a counterpart adhered by the ACF.

As another example, the ACF may contain a plurality of particles formed by coating an insulating core with a conductive material. In this case, as the conductive material is deformed (pressed) in a portion to which heat and pressure are applied, the portion is made to be conductive in the thickness direction of the film. As another example, the conductive material may be disposed through the insulating base member in the Z-axis direction to provide conductivity in the thickness direction of the film. In this case, the conductive material may have a pointed end.

The ACF may be a fixed array ACF in which conductive balls are inserted into one surface of the insulating base member. More specifically, the insulating base member may be formed of an adhesive material, and the conductive balls may be intensively disposed on the bottom portion of the insulating base member. Thus, when the base member is subjected to heat and pressure, it may be deformed together with the conductive balls, exhibiting conductivity in the vertical direction.

However, the present disclosure is not necessarily limited thereto, and the ACF may be formed by randomly mixing conductive balls in the insulating base member, or may be composed of a plurality of layers with conductive balls arranged on one of the layers (as a double-ACF).

The anisotropic conductive paste may be a combination of a paste and conductive balls, and may be a paste in which conductive balls are mixed with an insulating and adhesive base material. Also, the solution containing conductive particles may be a solution containing any conductive particles or nanoparticles.

Referring back to FIG. 3A, the second electrode 140 is positioned on the insulating layer 160 and spaced apart from the auxiliary electrode 170. That is, the conductive adhesive layer 130 is disposed on the insulating layer 160 having the auxiliary electrode 170 and the second electrode 140 positioned thereon.

After the conductive adhesive layer 130 is formed with the auxiliary electrode 170 and the second electrode 140 positioned on the insulating layer 160, the semiconductor light emitting device 150 is connected thereto in a flip-chip form by applying heat and pressure. Thereby, the semiconductor light emitting device 150 is electrically connected to the first electrode 120 and the second electrode 140.

FIG. 4 is a conceptual view illustrating the flip-chip type semiconductor light emitting device of FIG. 3.

Referring to FIG. 4, the semiconductor light emitting device may be a flip chip-type light emitting device.

For example, the semiconductor light emitting device may include a p-type electrode 156, a p-type semiconductor layer 155 on which the p-type electrode 156 is formed, an active layer 154 formed on the p-type semiconductor layer 155, an n-type semiconductor layer 153 formed on the active layer 154, and an n-type electrode 152 disposed on the n-type semiconductor layer 153 and horizontally spaced apart from the p-type electrode 156. In this case, the p-type electrode 156 may be electrically connected to the auxiliary electrode 170, which is shown in FIG. 3, by the conductive adhesive layer 130, and the n-type electrode 152 may be electrically connected to the second electrode 140.

Referring back to FIGS. 2, 3A and 3B, the auxiliary electrode 170 may be elongated in one direction. Thus, one auxiliary electrode may be electrically connected to the plurality of semiconductor light emitting devices 150. For example, p-type electrodes of semiconductor light emitting devices on left and right sides of an auxiliary electrode may be electrically connected to one auxiliary electrode.

More specifically, the semiconductor light emitting device 150 may be press-fitted into the conductive adhesive layer 130 by heat and pressure. Thereby, only the portions of the semiconductor light emitting device 150 between the p-type electrode 156 and the auxiliary electrode 170 and between the n-type electrode 152 and the second electrode 140 may exhibit conductivity, and the other portions of the semiconductor light emitting device 150 do not exhibit conductivity as they are not press-fitted. In this way, the conductive adhesive layer 130 interconnects and electrically connects the semiconductor light emitting device 150 and the auxiliary electrode 170 and interconnects and electrically connects the semiconductor light emitting device 150 and the second electrode 140.

The plurality of semiconductor light emitting devices 150 may constitute a light emitting device array, and a phosphor layer 180 may be formed on the light emitting device array.

The light emitting device array may include a plurality of semiconductor light emitting devices having different luminance values. Each semiconductor light emitting device 150 may constitute a unit pixel and may be electrically connected to the first electrode 120. For example, a plurality of first electrodes 120 may be provided, and the semiconductor light emitting devices may be arranged in, for example, several columns. The semiconductor light emitting devices in each column may be electrically connected to any one of the plurality of first electrodes.

In addition, since the semiconductor light emitting devices are connected in a flip-chip form, semiconductor light emitting devices grown on a transparent dielectric substrate may be used. The semiconductor light emitting devices may be, for example, nitride semiconductor light emitting devices. Since the semiconductor light emitting device 150 has excellent luminance, it may constitute an individual unit pixel even when it has a small size.

As shown in FIGS. 3A and 3B, a partition wall 190 may be formed between the semiconductor light emitting devices 150. In this case, the partition wall 190 may serve to separate individual unit pixels from each other, and may be integrated with the conductive adhesive layer 130. For example, by inserting the semiconductor light emitting device 150 into the ACF, the base member of the ACF may form the partition wall.

In addition, when the base member of the ACF is black, the partition wall 190 may have reflectance and increase contrast even without a separate black insulator.

As another example, a reflective partition wall may be separately provided as the partition wall 190. In this case, the partition wall 190 may include a black or white insulator depending on the purpose of the display device. When a partition wall including a white insulator is used, reflectivity may be increased. When a partition wall including a black insulator is used, it may have reflectance and increase contrast.

The phosphor layer 180 may be positioned on the outer surface of the semiconductor light emitting device 150. For example, the semiconductor light emitting device 150 may be a blue semiconductor light emitting device that emits blue (B) light, and the phosphor layer 180 may function to convert the blue (B) light into a color of a unit pixel. The phosphor layer 180 may be a red phosphor 181 or a green phosphor 182 constituting an individual pixel.

That is, the red phosphor 181 capable of converting blue light into red (R) light may be laminated on a blue semiconductor light emitting device at a position of a unit pixel of red color, and the green phosphor 182 capable of converting blue light into green (G) light may be laminated on the blue semiconductor light emitting device at a position of a unit pixel of green color. Only the blue semiconductor light emitting device may be used alone in the portion constituting the unit pixel of blue color. In this case, unit pixels of red (R), green (G), and blue (B) may constitute one pixel. More specifically, a phosphor of one color may be laminated along each line of the first electrode 120. Accordingly, one line on the first electrode 120 may be an electrode for controlling one color. That is, red (R), green (G), and blue (B) may be sequentially disposed along the second electrode 140, thereby implementing a unit pixel.

However, embodiments of the present disclosure are not limited thereto. Unit pixels of red (R), green (G), and blue (B) may be implemented by combining the semiconductor light emitting device 150 and the quantum dot (QD) rather than using the phosphor.

Also, a black matrix 191 may be disposed between the phosphor conversion layers to improve contrast. That is, the black matrix 191 may improve contrast of light and darkness.

However, embodiments of the present disclosure are not limited thereto, and anther structure may be applied to implement blue, red, and green colors.

FIGS. 5A to 5C are conceptual views illustrating various examples of implementation of colors in relation to a flip-chip type semiconductor light emitting device.

Referring to FIG. 5A, each semiconductor light emitting device may be implemented as a high-power light emitting device emitting light of various colors including blue by using gallium nitride (GaN) as a main material and adding indium (In) and/or aluminum (Al).

In this case, each semiconductor light emitting device may be a red, green, or blue semiconductor light emitting device to form a unit pixel (sub-pixel). For example, red, green, and blue semiconductor light emitting devices R, G, and B may be alternately disposed, and unit pixels of red, green, and blue may constitute one pixel by the red, green and blue semiconductor light emitting devices. Thereby, a full-color display may be implemented.

Referring to FIG. 5B, the semiconductor light emitting device 150a may include a white light emitting device W having a yellow phosphor conversion layer, which is provided for each device. In this case, in order to form a unit pixel, a red phosphor conversion layer 181, a green phosphor conversion layer 182, and a blue phosphor conversion layer 183 may be disposed on the white light emitting device W. In addition, a unit pixel may be formed using a color filter repeating red, green, and blue on the white light emitting device W.

Referring to FIG. 5C, a red phosphor conversion layer 181, a green phosphor conversion layer 185, and a blue phosphor conversion layer 183 may be provided on an ultraviolet light emitting device. Not only visible light but also ultraviolet (UV) light may be used in the entire region of the semiconductor light emitting device. In an embodiment, UV may be used as an excitation source of the upper phosphor in the semiconductor light emitting device.

Referring back to this example, the semiconductor light emitting device is positioned on the conductive adhesive layer to constitute a unit pixel in the display device. Since the semiconductor light emitting device has excellent luminance, individual unit pixels may be configured despite even when the semiconductor light emitting device has a small size.

Regarding the size of such an individual semiconductor light emitting device, the length of each side of the device may be, for example, 80 μm or less, and the device may have a rectangular or square shape. When the semiconductor light emitting device has a rectangular shape, the size thereof may be less than or equal to 20 μm×80 μm.

In addition, even when a square semiconductor light emitting device having a side length of 10 μm is used as a unit pixel, sufficient brightness to form a display device may be obtained.

Therefore, for example, in case of a rectangular pixel having a unit pixel size of 600 μm×300 μm (i.e., one side by the other side), a distance of a semiconductor light emitting device 150, 150a, or 150b becomes sufficiently long relatively.

Thus, in this case, it is able to implement a flexible display device having high image quality over HD image quality.

The above-described display device using the semiconductor light emitting device may be prepared by a new fabricating method. Such a fabricating method will be described with reference to FIG. 6 as follows.

FIG. 6 shows cross-sectional views of a method of fabricating a display device using a semiconductor light emitting device according to the present disclosure.

Referring to FIG. 6, first of all, a conductive adhesive layer 130 is formed on an insulating layer 160 located between an auxiliary electrode 170 and a second electrode 140. The insulating layer 160 is tacked on a wiring substrate 110. On the wiring substrate 110, a first electrode 120, the auxiliary electrode 170 and the second electrode 140 are disposed. In this case, the first electrode 120 and the second electrode 140 may be disposed in mutually orthogonal directions, respectively. In order to implement a flexible display device, the wiring substrate 110 and the insulating layer 160 may include glass or polyimide (PI) each.

For example, the conductive adhesive layer 130 may be implemented by an anisotropic conductive film. To this end, an anisotropic conductive film may be coated on the substrate on which the insulating layer 160 is located.

Subsequently, a temporary substrate 112, on which a plurality of semiconductor light emitting devices 150 configuring individual pixels are located to correspond to locations of the auxiliary electrode 170 and the second electrodes 140, is disposed in a manner that the semiconductor light emitting device 150 confronts the auxiliary electrode 170 and the second electrode 140.

In this regard, the temporary substrate 112 is a growing substrate for growing the semiconductor light emitting device 150 and may include a sapphire or silicon substrate.

The semiconductor light emitting device is configured to have a space and size for configuring a display device when formed in unit of wafer, thereby being effectively used for the display device.

Subsequently, the wiring substrate 110 and the temporary substrate 112 are thermally compressed together. For example, the wiring substrate and the second substrate 112 may be subjected to thermocompression by applying an ACF press head. By the thermocompression, the wiring substrate 110 and the temporary substrate 112 are bonded together. Owing to the property of an anisotropic conductive film having conductivity by thermocompression, only a portion among the semiconductor light emitting device 150, the auxiliary electrode 170 and the second electrode 140 has conductivity, via which the electrodes and the semiconductor light emitting device 150 may be connected electrically. In this case, the semiconductor light emitting device 150 is inserted into the anisotropic conductive film, by which a partition may be formed between the semiconductor light emitting devices 150.

Then the temporary substrate 112 is removed. For example, the temporary substrate 112 may be removed using Laser Lift-Off (LLO) or Chemical Lift-Off (CLO).

Finally, by removing the temporary substrate 112, the semiconductor light emitting devices 150 exposed externally. If necessary, the wiring substrate 110 to which the semiconductor light emitting devices 150 are coupled may be coated with silicon oxide (SiOx) or the like to form a transparent insulating layer (not shown).

In addition, a step of forming a phosphor layer on one side of the semiconductor light emitting device 150 may be further included. For example, the semiconductor light emitting device 150 may include a blue semiconductor light emitting device emitting Blue (B) light, and a red or green phosphor for converting the blue (B) light into a color of a unit pixel may form a layer on one side of the blue semiconductor light emitting device.

The above-described fabricating method or structure of the display device using the semiconductor light emitting device may be modified into various forms. For example, the above-described display device may employ a vertical semiconductor light emitting device.

Furthermore, a modification or embodiment described in the following may use the same or similar reference numbers for the same or similar configurations of the former example and the former description may apply thereto.

FIG. 7 is a perspective diagram of a display device using a semiconductor light emitting device according to another embodiment of the present disclosure, FIG. 8 is a cross-sectional diagram taken along a cutting line D-D shown in FIG. 8, and FIG. 9 is a conceptual diagram showing a vertical type semiconductor light emitting device shown in FIG. 8.

Referring to the present drawings, a display device may employ a vertical semiconductor light emitting device of a Passive Matrix (PM) type.

The display device includes a substrate 210, a first electrode 220, a conductive adhesive layer 230, a second electrode 240 and at least one semiconductor light emitting device 250.

The substrate 210 is a wiring substrate on which the first electrode 220 is disposed and may contain polyimide (PI) to implement a flexible display device. Besides, the substrate 210 may use any substance that is insulating and flexible.

The first electrode 210 is located on the substrate 210 and may be formed as a bar type electrode that is long in one direction. The first electrode 220 may be configured to play a role as a data electrode.

The conductive adhesive layer 230 is formed on the substrate 210 where the first electrode 220 is located. Like a display device to which a light emitting device of a flip chip type is applied, the conductive adhesive layer 230 may include one of an Anisotropic Conductive Film (ACF), an anisotropic conductive paste, a conductive particle contained solution and the like. Yet, in the present embodiment, a case of implementing the conductive adhesive layer 230 with the anisotropic conductive film is exemplified.

After the conductive adhesive layer has been placed in the state that the first electrode 220 is located on the substrate 210, if the semiconductor light emitting device 250 is connected by applying heat and pressure thereto, the semiconductor light emitting device 250 is electrically connected to the first electrode 220. In doing so, the semiconductor light emitting device 250 is preferably disposed to be located on the first electrode 220.

If heat and pressure is applied to an anisotropic conductive film, as described above, since the anisotropic conductive film has conductivity partially in a thickness direction, the electrical connection is established. Therefore, the anisotropic conductive film is partitioned into a conductive portion and a non-conductive portion.

Furthermore, since the anisotropic conductive film contains an adhesive component, the conductive adhesive layer 230 implements mechanical coupling between the semiconductor light emitting device 250 and the first electrode 220 as well as mechanical connection.

Thus, the semiconductor light emitting device 250 is located on the conductive adhesive layer 230, via which an individual pixel is configured in the display device. As the semiconductor light emitting device 250 has excellent luminance, an individual unit pixel may be configured in small size as well. Regarding a size of the individual semiconductor light emitting device 250, a length of one side may be equal to or smaller than 80 μm for example and the individual semiconductor light emitting device 250 may include a rectangular or square element. For example, the rectangular element may have a size equal to or smaller than 20 μm×80 μm.

The semiconductor light emitting device 250 may have a vertical structure.

Among the vertical type semiconductor light emitting devices, a plurality of second electrodes 240 respectively and electrically connected to the vertical type semiconductor light emitting devices 250 are located in a manner of being disposed in a direction crossing with a length direction of the first electrode 220.

Referring to FIG. 9, the vertical type semiconductor light emitting device 250 includes a p-type electrode 256, a p-type semiconductor layer 255 formed on the p-type electrode 256, an active layer 254 formed on the p-type semiconductor layer 255, an n-type semiconductor layer 253 formed on the active layer 254, and an n-type electrode 252 formed on then-type semiconductor layer 253. In this case, the p-type electrode 256 located on a bottom side may be electrically connected to the first electrode 220 by the conductive adhesive layer 230, and the n-type electrode 252 located on a top side may be electrically connected to a second electrode 240 described later. Since such a vertical type semiconductor light emitting device 250 can dispose the electrodes at top and bottom, it is considerably advantageous in reducing a chip size.

Referring to FIG. 8 again, a phosphor layer 280 may formed on one side of the semiconductor light emitting device 250. For example, the semiconductor light emitting device 250 may include a blue semiconductor light emitting device 251 emitting blue (B) light, and a phosphor layer 280 for converting the blue (B) light into a color of a unit pixel may be provided. In this regard, the phosphor layer 280 may include a red phosphor 281 and a green phosphor 282 configuring an individual pixel.

Namely, at a location of configuring a red unit pixel, the red phosphor 281 capable of converting blue light into red (R) light may be stacked on a blue semiconductor light emitting device. At a location of configuring a green unit pixel, the green phosphor 282 capable of converting blue light into green (G) light may be stacked on the blue semiconductor light emitting device. Moreover, the blue semiconductor light emitting device may be singly usable for a portion that configures a blue unit pixel. In this case, the unit pixels of red (R), green (G) and blue (B) may configure a single pixel.

Yet, the present disclosure is non-limited by the above description. In a display device to which a light emitting device of a flip chip type is applied, as described above, a different structure for implementing blue, red and green may be applicable.

Regarding the present embodiment again, the second electrode 240 is located between the semiconductor light emitting devices 250 and connected to the semiconductor light emitting devices electrically. For example, the semiconductor light emitting devices 250 are disposed in a plurality of columns, and the second electrode 240 may be located between the columns of the semiconductor light emitting devices 250.

Since a distance between the semiconductor light emitting devices 250 configuring the individual pixel is sufficiently long, the second electrode 240 may be located between the semiconductor light emitting devices 250.

The second electrode 240 may be formed as an electrode of a bar type that is long in one direction and disposed in a direction vertical to the first electrode.

In addition, the second electrode 240 and the semiconductor light emitting device 250 may be electrically connected to each other by a connecting electrode protruding from the second electrode 240. Particularly, the connecting electrode may include an n-type electrode of the semiconductor light emitting device 250. For example, the n-type electrode is formed as an ohmic electrode for ohmic contact, and the second electrode covers at least one portion of the ohmic electrode by printing or deposition. Thus, the second electrode 240 and the n-type electrode of the semiconductor light emitting device 250 may be electrically connected to each other.

Referring to FIG. 8 again, the second electrode 240 may be located on the conductive adhesive layer 230. In some cases, a transparent insulating layer (not shown) containing silicon oxide (SiOx) and the like may be formed on the substrate 210 having the semiconductor light emitting device 250 formed thereon. If the second electrode 240 is placed after the transparent insulating layer has been formed, the second electrode 240 is located on the transparent insulating layer. Alternatively, the second electrode 240 may be formed in a manner of being spaced apart from the conductive adhesive layer 230 or the transparent insulating layer.

If a transparent electrode of Indium Tin Oxide (ITO) or the like is sued to place the second electrode 240 on the semiconductor light emitting device 250, there is a problem that ITO substance has poor adhesiveness to an n-type semiconductor layer. Therefore, according to the present disclosure, as the second electrode 240 is placed between the semiconductor light emitting devices 250, it is advantageous in that a transparent electrode of ITO is not used. Thus, light extraction efficiency can be improved using a conductive substance having good adhesiveness to an n-type semiconductor layer as a horizontal electrode without restriction on transparent substance selection.

Referring to FIG. 8 again, a partition 290 may be located between the semiconductor light emitting devices 250. Namely, in order to isolate the semiconductor light emitting device 250 configuring the individual pixel, the partition 290 may be disposed between the vertical type semiconductor light emitting devices 250. In this case, the partition 290 may play a role in separating the individual unit pixels from each other and be formed with the conductive adhesive layer 230 as an integral part. For example, by inserting the semiconductor light emitting device 250 in an anisotropic conductive film, a base member of the anisotropic conductive film may form the partition.

In addition, if the base member of the anisotropic conductive film is black, the partition 290 may have reflective property as well as a contrast ratio may be increased, without a separate block insulator.

For another example, a reflective partition may be separately provided as the partition 190. The partition 290 may include a black or white insulator depending on the purpose of the display device.

In case that the second electrode 240 is located right onto the conductive adhesive layer 230 between the semiconductor light emitting devices 250, the partition 290 may be located between the vertical type semiconductor light emitting device 250 and the second electrode 240 each. Therefore, an individual unit pixel may be configured using the semiconductor light emitting device 250. Since a distance between the semiconductor light emitting devices 250 is sufficiently long, the second electrode 240 can be placed between the semiconductor light emitting devices 250. And, it may bring an effect of implementing a flexible display device having HD image quality.

In addition, as shown in FIG. 8, a black matrix 291 may be disposed between the respective phosphors for the contrast ratio improvement. Namely, the black matrix 291 may improve the contrast between light and shade.

In the display device using the semiconductor light emitting device of the present disclosure described above, the semiconductor light emitting device is disposed on a wiring board in a flip chip type and used as an individual pixel.

FIG. 10 is a schematic diagram illustrating an example of a process for mounting a light emitting device using a conductive adhesive layer.

As described above, a conductive adhesive layer 30 may form a state in which a plurality of conductive balls 32 are dispersed in a non-conductive adhesive layer (paste) 31. In this case, the conductive balls 32 may be distributed throughout the adhesive layer 31.

Here, the conductive adhesive layer 30 may be an anisotropic conductive film (ACF).

As shown in (a) of FIG. 10, when the conductive adhesive layer 30 is placed on a horizontal light emitting device 40 in which the first electrode 41 and the second electrode 42 are located on the same plane, the same state as in (b) of FIG. 10 may be achieved to form an assembly 50.

As described above, the anisotropic conductive medium may be, for example, conductive balls or conductive particles. For example, the anisotropic conductive film (ACF) is a film in which the conductive balls 32 are mixed with an insulating base member (adhesive layer; 31), and when heat and/or pressure is applied thereto, only a specific portion is caused to have conductivity due to the conductive balls 32.

FIG. 11 is a photograph showing an actual example of a light emitting device attached by a conductive adhesive layer.

As shown, conductive balls that have conductivity are attached between a light emitting device 40 and electrodes (not visible because they are covered by the light emitting device), but conductive balls 32 that do not have conductivity are distributed in other portions.

FIG. 12 is a cross-sectional schematic view illustrating an example of a process of mounting a light emitting device using a conductive adhesive layer.

Referring to FIG. 12, a state of an assembly 50 in which the light emitting device 40 is bonded to a substrate 60 by the conductive balls 32 is illustrated.

That is, the electrode 41 of the light emitting device 40 and the electrode (e.g., an anode; 61) on the substrate 60 may be electrically connected by the conductive balls 32 dispersed on the adhesive layer 31.

In this case, the conductive balls 32 applies a bonding pressure (P) from the upper side while being positioned between the electrode 41 of the light emitting device 40 and the electrode 61 on the substrate 60. Due to the bonding pressure (P), the conductive balls 32 electrically connect the electrode 41 of the light emitting device 40 and the electrode 61 on the substrate 60.

On the other hand, when the bonding pressure (P) is applied thereto, the adhesive layer 31 flows in the peripheral direction (F). That is, the flow (F) of the adhesive layer 31 in the peripheral direction is caused by the action of the bonding pressure (P).

As the conductive balls 32 flow together with the adhesive layer 31 by the flow of the adhesive layer 31, the electrode 41 of the light emitting device 40 and the electrode 61 on the substrate 60 may not be electrically connected (circuit open).

In particular, although several light emitting devices 40 can be electrically connected, there may be a limit to the electrical connection of the entire array of many light emitting devices 40 used in a display. That is, in the electrical connection of the entire array of light emitting devices 40 used as sub-pixels of the display device, there may occur a phenomenon in which the plurality of light emitting devices 40 are not electrically connected to the electrodes 61 of the substrate 60 (open).

In addition, when the number of conductive balls 32 is increased to resolve this phenomenon, a short circuit may occur between the two electrodes 41 and 42 of the light emitting device 40 (see FIG. 10).

Therefore, an object of one embodiment of the present disclosure is to provide a light emitting device assembly 350 structure (see FIG. 13) that can solve the problem when using the conductive adhesive layer 30 as described above and a display device in which each pixel is configured by using the light emitting device assembly 350 structure.

According to an embodiment of the present disclosure, the conductive ball may be localized only on the electrode of the light emitting device, thereby solving the problem of using the conventional conductive adhesive layer 30 described above.

FIG. 13 is a schematic diagram illustrating a process of mounting a light emitting device using a conductive adhesive layer according to an embodiment of the present disclosure.

Referring to FIG. 13, conductive balls 355 may be localized only on the first electrode 352 and the second electrode 353 of the light emitting device 351. In addition, the conductive balls 355 localized only on the first electrode 352 and the second electrode 353 may be covered by an adhesive layer 356.

As shown in (a) of FIG. 13, in a horizontal light emitting device 351 in which the first electrode 352 and the second electrode 353 are positioned on the same plane, the conductive balls 355 are localized only on the first electrode 352 and the second electrode 353 and an adhesive layer 345 is then coated, which results in the state as shown in (b) of FIG. 13.

The conductive balls 355 are localized only on the first electrode 352 and the second electrode 353 on the light emitting device 351 to form an anisotropic conductive medium. In this way, a film in which the conductive balls 355 are mixed with an insulating base member (adhesive layer; 356) is positioned on the light emitting device 351 to form a light emitting device assembly 350.

In this case, when heat and/or pressure is applied to the light emitting device assembly 350, only the first electrode 352 and the second electrode 353 of the light emitting device 351 are caused to have conductivity due to the conductive balls 355.

In addition, a separate adhesive layer 354 (see FIG. 15) may be provided to localize the conductive balls 355 only on the first electrode 352 and the second electrode 353. The adhesive layer 354 may be positioned on the first electrode 352 and the second electrode 353 to be spaced apart from each other. That is, the adhesive layer 354 may be provided to separately cover the first electrode 352 and the second electrode 353.

Meanwhile, a vertical light emitting device may be used instead of a horizontal light emitting device.

FIG. 14 is a photograph showing an actual example of a light emitting device attached by a conductive adhesive layer according to an embodiment of the present disclosure.

As shown, it can be seen that the conductive balls 355 are localized only on the first electrode 351 and the second electrode 353 of the light emitting device 351.

Since the conductive balls 355 may be localized only on the first electrode 351 and the second electrode 353 of the light emitting device 351, it is possible to prevent some light emitting devices from being not electrically connected normally or the two electrodes from being short-circuited when manufacturing the display device as described above.

FIG. 15 is a cross-sectional view illustrating a display device using a semiconductor light emitting device according to an embodiment of the present disclosure.

Referring to FIG. 15, a display device may include a plurality of anode electrodes 340, a plurality of cathode electrodes 342 respectively positioned on one side of the anode electrodes 340, and a plurality of light emitting device 350 assemblies each electrically connected to the anode electrode 340 and the cathode electrode 342 to respectively constituting sub-pixels.

The anode electrode 340 and the cathode electrode 342 may be arranged in pairs on the substrate 310. Here, the substrate 310 may be a thin film transistor (TFT) substrate. That is, the light emitting device assemblies arranged on the thin film transistor substrate 310 may implement a display device using semiconductor light emitting devices.

That is, referring to FIG. 15, the display device 300 having an active matrix (AM) structure is shown. However, the present disclosure is not limited to the AM structure and may be implemented as a display device having a PM (passive matrix) structure.

Here, the anode electrode 340 may be connected through a drain electrode (Drain) and a via electrode 341 of the thin film transistor 311 serving as a switching transistor.

The thin film transistor substrate 310 may include a plurality of individual thin film transistors 311. The thin film transistor 311 may include a gate electrode (Gate), a gate insulator (GI) positioned on the gate electrode (Gate), a drain electrode (Drain) and a source electrode (Source) positioned on the gate insulator (GI). Hereinafter, a detailed description of the thin film transistor substrate 310 will be omitted.

A color correction layer 330 may be positioned in the insulating layer 320 corresponding to each sub-pixel 350. The color correction layer 330 may correct the color of each pixel.

A planarization layer 312 may be positioned on the thin film transistor substrate 310, and the insulating layer 320 may be positioned on the planarization layer. When implementing a flexible display, the insulating layer 320 may be formed of a polymer. In this case, the insulating layer 320 may be referred to as a polymer insulating layer 320. In addition, the thickness of the polymer insulating layer 320 may be adjusted for assembly of the light emitting device assembly 350. For example, the thickness of the polymer insulating layer 320 may be smaller than the diameter of the conductive ball 355. Details will be described later.

The anode electrode (positive electrode) 340 connected to the individual thin film transistor 311 may be disposed on the insulating layer 320. As described above, the individual thin film transistor 311 and the anode electrode 340 may be connected through the via electrode 341 passing through the planarization layer 312 and the insulating layer 320.

As described above, the light emitting device assembly 350 may include a light emitting device 351, a first electrode 352 positioned on the light emitting device 351 and electrically connected to the anode electrode 340 through the conductive balls 355, and a second electrode 353 positioned on the light emitting device 351 and electrically connected to the cathode 342 through the conductive balls 355.

In addition, the light emitting device assembly 350 may include first adhesive layers 354 positioned spaced apart from each other on the first electrode 352 and a second adhesive layer with non-conductivity (Non-conducting film (NCF)) 356 positioned on the first adhesive layer 354.

In this case, the second adhesive layer 356 may cover the first adhesive layers 354 at two positions spaced apart from each other. Also, the second adhesive layer 356 may cover the entire light emitting device 351.

Referring to FIG. 15, the conductive balls 355 may be localized on the first adhesive layer 354. That is, the conductive balls 355 may be localized between the anode electrode 340 and the first electrode 352 and between the cathode electrode 342 and the second electrode 352. These localized conductive balls 355 have been identified above.

The first adhesive layer 354 may be a conductive or non-conductive adhesive layer. FIG. 15 illustrates a state in which the conductive balls 355 are positioned between the first adhesive layer 354 and the anode electrode 340 and between the first adhesive layer 354 and the cathode electrode 342 for convenience. However, in practice, the conductive balls 355 may penetrate the first adhesive layer 354 to contact the first electrode 352 and the second electrode 353, separately.

In addition, as described above, in the bonding process of the light emitting device assembly 350, the light emitting device assembly 350 is subjected to pressure while being placed on the anode electrode 340 and the cathode electrode 342, and in this case, the conductive balls 355 penetrate the first adhesive layer 354 and the second adhesive layer 355 to electrically connect the anode electrode 340 and the cathode electrode 342 to the first electrode 352 and the second electrode 353, respectively. Also, the shape of the conductive balls 355 may practically be changed from a spherical shape to an elliptical shape, for example.

On the other hand, the conductive balls 355 localized between the anode electrode 340 and the first electrode 352 and between the cathode electrode 342 and the second electrode 352 may be formed by patterning an anisotropic conductive film (ACF).

In addition, at least one of the first adhesive layer 354 and the second adhesive layer 355 may be colored in white, black, or other colors by using a coloring material capable of producing a color such as TiO2.

FIGS. 16 to 26 are cross-sectional views illustrating a process of manufacturing a display device using semiconductor light emitting devices according to an embodiment of the present disclosure.

Hereinafter, the process of manufacturing a display device according to an embodiment of the present disclosure will be described in detail with reference to FIGS. 16 to 26.

First, referring to FIG. 16, a light emitting device 351 arranged on a first substrate 400 may be prepared. A plurality of light emitting devices 351 respectively forming sub-pixels of the display device may be provided on the first substrate 400. Although two light emitting devices 351 are illustrated in FIG. 16, this is only an example, and a plurality of light emitting devices 351 partitioned according to the pixel spacing (pixel pitch) of the display device may be provided on the first substrate 400.

In this case, the first substrate 400 may be a growth substrate on which the light emitting devices 351 are grown. For example, the light emitting device 351 may be a gallium nitride based semiconductor light emitting device. Also, for example, the first substrate 400 may be a sapphire substrate.

After a semiconductor layer for forming the light emitting device 351 is formed on the first substrate 400, the semiconductor layer is partitioned and shaped through exposure and etching processes, and the first electrode 352 and the second electrode 353 are formed, thus manufacturing the light emitting devices 351 respectively forming sub-pixels. Such exposure and etching processes (hereinafter referred to as a photo process) are very high-precision processes, and when the light emitting device 351 manufactured by the photo process is transferred to the thin film transistor substrate 310 as it is, it can be very advantageous to realize a high-resolution display device.

Accordingly, an embodiment of the present disclosure may provide a method for directly transferring the light emitting device 351 to the thin film transistor substrate 310, light emitting device 351 being manufactured by being grown on the growth substrate and partitioned to form an individual unit sub-pixel.

Referring to FIG. 16, a first electrode 352 and a second electrode 353 may be provided on the same surface on each light emitting device 351 to be spaced apart from each other. That is, the light emitting device 351 may be a horizontal light emitting device.

In this case, as described above, the individual light emitting devices 351 may be arranged on the first substrate 400 at very precise distance intervals.

Thereafter, referring to FIG. 17, a first adhesive layer 354 may be formed on the first electrode 352 and the second electrode 353. As illustrated, the first adhesive layer 354 may be formed to cover the first electrode 352 and the second electrode 353 separately. Accordingly, the first adhesive layers 354 may be spaced apart from each other on the first electrode 352 and the second electrode 353. However, in some cases, the first adhesive layer 354 may also be formed between the individual light emitting devices 351.

Meanwhile, the first adhesive layer 354 may be conductive or non-conductive.

As described above, the first adhesive layer 354 may be locally formed on the first electrode 352 and the second electrode 353. Accordingly, the first adhesive layer 354 may have substantially the same shape as the first electrode 352 and/or the second electrode 353. In this case, the size of the first adhesive layer 354 may be larger than the size of the first electrode 352 and/or the second electrode 353.

Next, referring to FIGS. 18 and 19, conductive balls 355 may be positioned on the first adhesive layer 354. In this case, the conductive balls 355 are positioned only on the upper surfaces of the first adhesive layers 354 that are locally positioned on the first electrode 352 and the second electrode 353, so that the conductive balls 355 may be localized on the first electrode. 352 and the second electrode 353.

In a method of attaching the conductive balls 355 to the upper surfaces of the first adhesive layers 354, as shown in FIGS. 18 and 19, a sheet 500 in which the conductive balls 355 are dispersed may be used.

That is, the conductive balls 355 may be attached to the upper surface of the first adhesive layer 354 by allowing the first adhesive layer 354 localized on the first electrode 352 and the second electrode 353 to contact a sheet 500 in which the conductive balls 355 are dispersed.

Meanwhile, as shown in FIG. 20, the conductive balls 355 may be attached to the upper surface of the first adhesive layer 354 in the same manner by spraying the conductive balls 355 onto the first adhesive layer 354 localized on the first electrode 352 and the second electrode 353, through a nozzle 510.

FIG. 21 illustrates a state in which the conductive balls 355 are attached only to the upper surface of the first adhesive layer 354 localized on the first electrode 352 and the second electrode 353 by the above-described process.

Meanwhile, as described above, the conductive balls 355 localized between the cathode electrode 342 and the second electrode 352 may be formed by patterning the anisotropic conductive film (ACF).

Next, referring to FIG. 22, the conductive balls 355 attached only to the upper surface of the first adhesive layer 354 localized on the first electrode 352 and the second electrode 353 may be covered by using the second adhesive layer 356.

The second adhesive layer 356 may cover the entire light emitting device 351. In this way, the light emitting device 351 covered by the second adhesive layer 356 may constitute the light emitting device assembly 350.

In this case, the shape of the second adhesive layer 356 may be substantially the same as the shape of the light emitting device 351.

Thereafter, referring to FIG. 23, the light emitting device assembly 350 may be attached on the second substrate 310.

That is, the first electrode 352 and the second electrode 353 of the each light emitting device 351 may be boned to the anode electrode 340 and the cathode electrode 342 disposed on the second substrate 310 using the conductive balls 355.

Specifically, the second adhesive layer 356 of the light emitting device assembly 350 is directed toward the anode electrode 340 and the cathode electrode 342 of the second substrate 310 to bond the second adhesive layer 356 to the second substrate 310.

In this case, the first electrode 352 and the second electrode 353 are aligned with the positions of the anode electrode 340 and the cathode electrode 342 disposed on the second substrate 310 to bond the light emitting device assembly 350 to the anode electrode 340 and the cathode electrode 342 disposed on the second substrate 310.

Thereafter, by applying pressure, the conductive balls 355 may contact between the first electrode 352 and the anode electrode 340 to electrically connect the first electrode 352 and the anode electrode 340. In some cases, heat may be applied together with the pressure.

In addition, the conductive balls 355 may contact between the second substrate 310 and the cathode electrode 342 to electrically connect the second substrate 310 and the cathode electrode 342.

In this case, as described above, the second substrate 310 may be a thin film transistor substrate capable of implementing an active matrix type display.

Next, referring to FIG. 24, the first substrate 400 may be removed.

As described above, the first substrate 400 is a growth substrate for the light emitting device 351, and may be, for example, a sapphire substrate. The first substrate 400 may be removed by a laser lift-off method, a chemical lift-off method, or the like.

That is, the interface between the growth surface of the light emitting device 351 and the first substrate 400 may be separated by irradiating a laser from the first substrate 400 toward the light emitting device assembly 350.

FIGS. 23 and 24 show a state in which all the light emitting device assemblies 350 are attached at the same time or as a group.

However, as shown in FIGS. 25 and 26, it is also possible to selectively assemble some light emitting device assemblies 350. For example, the light emitting device assembly 350 may be assembled by color, or the light emitting device assembly 350 may be assembled for each group by classifying the light emitting device assemblies 350 into groups for a specific purpose.

For example, a method of selectively attaching the blue light emitting device assembly 350 first and then attaching the green light emitting device assembly 350 is possible.

FIG. 25 shows a state in which the light emitting device assemblies 350 on one side only are attached to the second substrate 310. Then, referring to FIG. 26, only the attached light emitting device assemblies 350 may be selectively separated from the first substrate 400.

In FIGS. 24 and 26, for convenience, it is shown that the conductive balls 355 are positioned between the first adhesive layer 354 and the anode electrode 340 and between the first adhesive layer 354 and the cathode electrode 342. However, in practice, the conductive balls 355 may penetrate the first adhesive layer 354 to contact the first electrode 352 and the second electrode 353, separately.

In addition, as described above, in the bonding process of the light emitting device assembly 350, the light emitting device assembly 350 is subjected to pressure while being placed on the anode electrode 340 and the cathode electrode 342, and in this case, the conductive balls 355 penetrate the first adhesive layer 354 and the second adhesive layer 355 to electrically connect the anode electrode 340 and the cathode electrode 342 to the first electrode 352 and the second electrode 353, respectively. Also, the shape of the conductive balls 355 may practically be changed from a spherical shape to an elliptical shape, for example.

FIG. 27 is a photograph illustrating a state in which a light emitting device of a display device using a semiconductor light emitting device is bonded according to an embodiment of the present disclosure. In addition, FIG. 28 is a photograph showing a state in which the light emitting device is turned on in the state of FIG. 27.

Referring to FIG. 27, it is shown that the second adhesive layer 356 is positioned outside the light emitting device 351.

Since the conductive balls 355 are all located under the electrode of the light emitting device 351, the conductive balls 355 are not shown in the photograph. That is, the light emitting device 351 is bonded while the conductive balls 355 are localized on the electrodes of the light emitting device 351, so that the conductive balls 355 are not visible in other portions.

FIG. 28 shows a state in which the light emitting device 351 bonded as described above are turned on.

FIG. 29 is a cross-sectional photograph showing an example of a state in which a light emitting device is boned to an electrode by conductive balls. Also, FIG. 30 is a cross-sectional view illustrating a second substrate of a display device using a semiconductor light emitting device according to an embodiment of the present disclosure.

As described above, the planarization layer 312 may be located on the thin film transistor substrate 310, and the insulating layer 320 may be located on the planarization layer. When implementing a flexible display, the insulating layer 320 may be formed of a polymer. In this case, the insulating layer 320 may be referred to as a polymer insulating layer 320 (PAC).

In this case, the thickness of the polymer insulating layer 320 may be adjusted for assembly of the light emitting device assembly 350. For example, the thickness of the polymer insulating layer 320 may be smaller than the diameter of the conductive ball 355.

As described above, the light emitting device 351 (LED) is bonded to the electrodes 340 and 342 by applying pressure. However, when the thickness of the polymer insulating layer 320 is thick, as shown in portion A of FIG. 29, the electrodes 340 and 342 may collapse due to pressure.

The collapse of the electrodes 340 and 342 caused by the pressure may be improved according to the thickness "T" of the polymer insulating layer 320. For example, depending on the thickness "T" of the polymer insulating layer 320, the pressure required for bonding of the light emitting device 351 may be distributed to the planarization layer 312 on the lower side.

For example, when the thickness T of the polymer insulating layer 320 is smaller than the diameter of the conductive ball 355, the propagation of the pressure may effectively spread to the planarization layer 312 on the lower side, which is made of hard glass.

More preferably, the thickness T of the polymer insulating layer 320 may be 70% or less of the diameter of the conductive ball 355. However, for the intrinsic insulating properties or for the provision of the color correction layer 330, the thickness T of the polymer insulating layer 320 may be equal to or greater than the half (50%) of the diameter of the conductive ball 355. That is, the thickness T of the polymer insulating layer 320 may be 50% to 100% of the diameter of the conductive ball 355. Also, as described above, the thickness T of the polymer insulating layer 320 may be 50% to 70% of the diameter of the conductive ball 355.

As described above, according to the embodiment of the present disclosure, it is possible to directly transfer the light emitting device 351 from the growth substrate 400 to the thin film transistor substrate 310.

In this case, as described above, problems caused by the conductive balls, that is, problems in which some light emitting devices are not electrically connected, or the two electrodes of one light emitting device are short-circuited, may not occur.

As described above, it is possible to directly transfer the light emitting device 351 from the growth substrate 400 to the thin film transistor substrate 310, making it very advantageous to implement a high-resolution display device.

The reason for this is that the arrangement of the light emitting devices 351 manufactured by a precise photo process may be disturbed if an intermediate transfer substrate such as a donor substrate is used. In this process, the precision of the position of the array may be deteriorated.

Therefore, when the light emitting device 351 manufactured by a precise photo process is transferred to the thin film transistor substrate 310 as it is, it may be very advantageous to implement a high-resolution display device.

Moreover, according to the present disclosure, the problems caused by the use of the conventional conductive balls can be solved, thus greatly improving the reliability, precision, and mass productivity of a micro LED display device.

In addition, the light emitting device may be selectively mounted in a desired position on the thin film transistor substrate, so that a display device may be manufactured in a hybrid combination of organic and inorganic light emitting devices. Therefore, it is possible to develop a device having the advantages of LED (inorganic light emitting device) and OLED (organic light emitting device).

In particular, since the LED has no moisture barrier layer unlike OLED, stacking is simple, making it suitable to be applied to a flexible display. For example, referring to FIG. 15, the size of the light emitting device assembly 350 is enlarged, but the area occupied by the light emitting device assembly 350 in the entire display device 300 is very small, and the remaining portion may have properties/structures that can be mostly bent.

Accordingly, the display device 300 according to the embodiment of the present disclosure is suitable for a flexible display.

The above description is merely illustrative of the technical idea of the present disclosure, and various modifications and variations may be made without departing from the essential characteristics of the present disclosure by those skilled in the art to which the present disclosure pertains.

Accordingly, the embodiment disclosed in the present disclosure is not intended to limit the technical idea of the present disclosure but to describe the present disclosure, and the scope of the technical idea of the present disclosure is not limited by the embodiment.

The scope of protection of the present disclosure should be interpreted by the following claims, and all technical ideas within the scope equivalent thereto should be construed as being included in the scope of the present disclosure.

INDUSTRIAL APPLICABILITY

The present disclosure may provide a light emitting device and a manufacturing method using a semiconductor light emitting device having a micrometer (μm) unit size.

The invention claimed is:

1. A method for manufacturing a display device including a light emitting device, the method comprising:
   forming first adhesive layers spaced apart from each other on a first electrode and a second electrode of the light emitting device that is arranged on a first substrate;
   localizing conductive balls on the first adhesive layers;
   forming a second adhesive layer on the conductive balls and the first adhesive layers;
   bonding the first electrode and the second electrode to an anode electrode and a cathode electrode disposed on a second substrate using the conductive balls; and
   separating the first substrate from the light emitting device.

2. The method of claim 1, wherein the first adhesive layers are a conductive adhesive layer.

3. The method of claim 1, wherein the second adhesive layer covers the first adhesive layers that are spaced apart from each other.

4. The method of claim 1, wherein the second adhesive layer covers the light emitting device entirely.

5. The method of claim 1, wherein the localizing of the conductive balls includes transferring the conductive balls on the first adhesive layers that are spaced apart from each other.

6. The method of claim 1, wherein the second adhesive layer is non-conductive.

7. The method of claim 1, wherein the conductive balls are localized between the anode electrode and the first electrode, and between the cathode electrode and the second electrode.

8. The method of claim 1, wherein the first substrate is a growth substrate on which the light emitting device is grown.

9. The method of claim 1, wherein the first substrate is separated by a laser lift-off method.

10. The method of claim 1, wherein the second substrate is a passive matrix substrate or a thin film transistor substrate for implementing an active matrix device.

11. A method of manufacturing a display device including a light emitting device, the method comprising:
    forming first adhesive layers spaced apart from each other on a first electrode and a second electrode of the light emitting device that is grown on a growth substrate and patterned into the light emitting device;
    localizing conductive balls on the first adhesive layers;
    forming a second adhesive layer on the conductive balls and the first adhesive layers;
    bonding the first electrode and the second electrode respectively to an anode electrode and a cathode electrode disposed on a driving substrate using the conductive balls; and
    separating the growth substrate from the light emitting device.

12. The method of claim 11, wherein the driving substrate is a passive matrix substrate or a thin film transistor substrate for implementing an active matrix device.

* * * * *